United States Patent
Takahashi

(10) Patent No.: US 7,141,829 B2
(45) Date of Patent: Nov. 28, 2006

(54) SEMICONDUCTOR LASER DEVICE WITH ANTIMONY AND CRYSTAL GROWTH METHOD

(75) Inventor: Koji Takahashi, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/473,035

(22) PCT Filed: Mar. 22, 2002

(86) PCT No.: PCT/JP02/02739

§ 371 (c)(1),
(2), (4) Date: Sep. 26, 2003

(87) PCT Pub. No.: WO02/078144

PCT Pub. Date: Oct. 3, 2002

(65) Prior Publication Data

US 2004/0084667 A1    May 6, 2004

(30) Foreign Application Priority Data

Mar. 27, 2001  (JP)  .............................. 2001-88935
Aug. 6, 2001   (JP)  .............................. 2001-237560

(51) Int. Cl.
*H01L 33/00*    (2006.01)

(52) U.S. Cl. ...................................... 257/102; 257/103

(58) Field of Classification Search ............ 257/79–103
See application file for complete search history.

(56) References Cited

U.S. PATENT DOCUMENTS

| | | | |
|---|---|---|---|
| 6,541,297 B1 | 4/2003 | Takahashi | |
| 6,798,809 B1 * | 9/2004 | Gambin et al. | ................ 372/45 |

FOREIGN PATENT DOCUMENTS

| | | |
|---|---|---|
| JP | 2000-312054 A | 11/2000 |
| JP | 2001-24282 | 1/2001 |

OTHER PUBLICATIONS

Shimizu et al; "High Performance CW 1.26μm GaInNAsSb-SQW and 1.20μm GaInAsSb-SWQ Ridge Lasers"; Electronics Letters, Sep. 28, 2000, vol. 36, No. 20, pp. 1701 to 1703.

Yang et al; "Molecular Beam Epitaxial Growth of InGaAsN:Sb/GaAs Quantum Wells for Long-Wavelength Semiconductor Lasers"; American Institute of Physics, Applied Physics Letters, Jul. 12, 1999, vol. 75, No. 2, pp. 178-180.

Yang et al; "High-Temperature Characteristics of 1.3 μm InGaAsN:Sb/GaAs Multiple-Quantum-Well Lasers Grown by Molecular-Beam Epitaxy"; American Institute of Physics, Applied Physics Letters; Feb. 14, 2000, vol. 76, No. 7, pp. 795-797.

Kondow et al; "GaInNAs: A Novel Material for Long-Wavelength-Range Laser Diodes With Excellent High-Temperature Performance"; Jpn. J. Appl. Phys., Feb. 1996, vol. 35, part 1, No. 2B, pp. 1273-1275.

(Continued)

Primary Examiner—Ori Nadav
(74) Attorney, Agent, or Firm—Nixon & Vanderhye, P.C.

(57) ABSTRACT

A semiconductor device (100) has, as its well layer, a III–V compound semiconductor layer (106) containing, as V-group components, nitrogen, antimony, and one or more V-group elements other than nitrogen and antimony to improve emission characteristics. Such a III–V compound semiconductor layer is formed by repeating a cycle including a process of simultaneously supplying a plurality of sources containing at lest indium, and a process of simultaneously supplying a plurality of sources not containing indium but containing antimony.

10 Claims, 13 Drawing Sheets

OTHER PUBLICATIONS

Nakahara et al; "1.3-μm Continuous-Wave Lasing Operation in GaInNAs Quantum- Well Lasers"; IEEE Photonics Technology Letters, Apr. 4, 1998, vol. 10, No. 4, pp. 487-488.

Shimizu et al; "Extremely Large Differential Gain of 1.26μm GaInNAsSb-SQW Ridge Lasers"; Electronics Letters, Jan. 4, 2001, vol. 37, No. 1, pp. 28-31.

Yang et al; "Low Threshold InGaAsN/GaAs Single Quantum Well Lasers Grown by Molecular Beam Epitaxy Using Sb Surfactant"; Electronics Letters, Jun. 24, 1999, vol. 35, No. 13, pp. 1082-1083.

Shimizu et al, "1.2μm Range GaInAs SQW Lasers Using Sb as Surfactant", Electronic Letters, vol. 36, No. 18, Aug. 3, 2000, pp. 1379-1381.

* cited by examiner

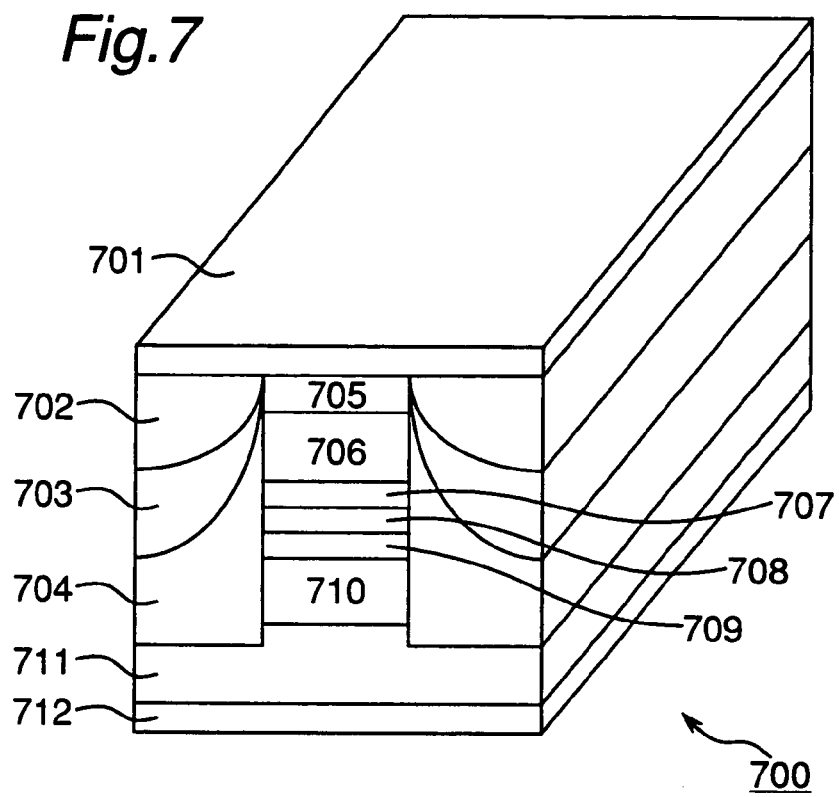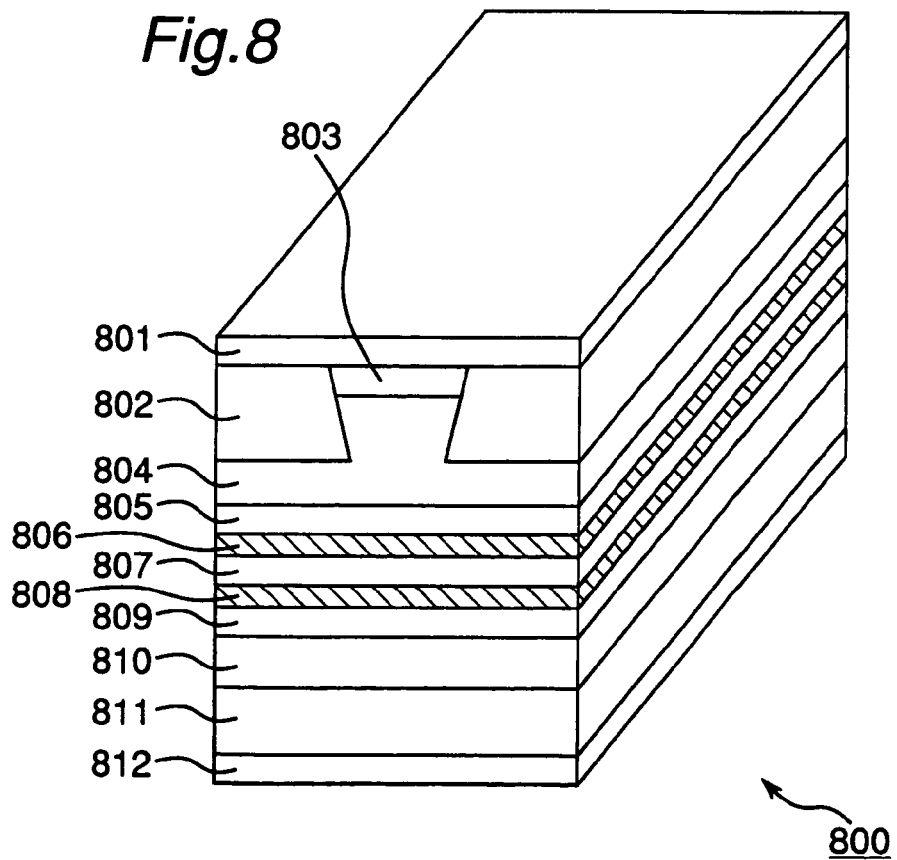

US 7,141,829 B2

SEMICONDUCTOR LASER DEVICE WITH ANTIMONY AND CRYSTAL GROWTH METHOD

This application is the U.S. national phase of international application PCT/JP02/02739 filed 22 Mar. 2002, which designated the US. PCT/Jp02/02739 claims priority to Japanese Application No. 2001-88935 filed 27 Mar. 2001 and Japanese Application No. 2001-237560 filed 06 Aug. 2001. The entire contents of these applications are incorporated herein by reference.

TECHNICAL FIELD

The present invention relates to a semiconductor device using a III–V compound semiconductor crystal containing, as V-group composition, nitrogen and at least one other V-group element, and a method of growing the crystal.

BACKGROUND ART

Recently, as a new material system that would greatly expand the utilization field of III–V compound semiconductors, there has been proposed a III–V compound semiconductor material comprising, as the V-group composition, nitrogen (N) at a mole fraction of not more than several % of the V-group content, and arsenic (As) and phosphorus (P). V-group elements such as As and P greatly differ from N in the atomic radius (N: 0.070 μm, As: 0.118 nm, P: 0.110 nm), and in the elcotronegativity (N: 3.5, As: 2.4, P: 2.5). Thus, by intermixing N and As, or N and P, or N and As and P, a singular physical property is generated. For example, in the case of GaInNAs, which is presumed to be an intermixture of GaInAs and several percent of GaInN having a larger bandgap width than that of GaInAs, bowing in the change of the bandgap width due to the intexmixing is extremely large. Thus, there is observed a phenomenon in which, although several percent of a system having a large bandgap width is intermixed, the bandgap width is nevertheless rapidly narrowed in conjunction with the intermixing.

GaInNAs thus obtained is industrially important because it can be used for a light-emitting layer of a light-emitting device that emits light at a wavelength of 1.3 μm, 1.55 μm or a longer wavelength, which are important wavelengths for optical fiber communication, while generally lattice-matched with an inexpensive and good GaAs substrate (or with a strain amount of not more than several percent).

Further, Japanese Journal of Applied Physics, Vol. 35, part 1, No. 2B, February 1996, pp 1273–1275 (first prior art) discloses that, in the case where a III–V compound semiconductor material in which N and As, or N and P, or N and As and P are intermixed, such as GaInNAs, is used as a material of an active layer of a semiconductor laser, the temperature characteristic of the semiconductor laser is remarkably improved. That is, in the case where part of an As content in GaInAs is replaced with an N content, the conduction band energy level in the bandgap of this mixed crystal semiconductor material is lowered, a conduction band energy difference $\Delta E_c$ in a hetero junction between the material and other materials such as GaAs increases. Therefore, confinement of electrons in the mixed crystal semiconductor material used as an active layer is remarkably enhanced, so that the characteristic temperature $T_o$ of the semiconductor laser is remarkably increased.

In Photonics Technology Letters, Vol. 10, No. 4, April 1998, p. 487 (second prior art), a semiconductor laser having the above construction is shown more specifically. That is, it has been reported that a semiconductor laser structure, wherein an active layer consisting of $Ga_{0.7}In_{0.3}N_{0.01}As_{0.99}$ quantum well layers and GaAs guide layers is interposed between $Al_{0.3}Ga_{0.7}As$ upper and lower cladding layers, was fabricated on a GaAs substrate, and that the semiconductor laser achieved a 1.31 μm continuous-wave lasing operation at room temperature for the first time among semiconductor lasers constructed of a system lattice-matching with the GaAs substrate.

In the mixed crystal system containing, as V-group contents, N and other V-group elements (such as As and P), there is a very large non-miscible region (miscibility gap), which does not form a stable mixed crystal system in a thermal equilibrium state. Thus, it becomes difficult to mix nitrogen in a crystal. For that reason, as the N mole fraction in the mixed crystal increases, a problem of rapid deterioration of light-emitting characteristics occurs. According to the study of the inventor of the present application, it has been found that, as the N mole fraction increases, light intensity of photoluminescence exponentially deteriorates.

BRIEF SUMMARY

The present invention was made in order to solve the above problem. That is, an objective is to provide a mixed crystal composition that can remarkably improve light emission characteristics of a III–V compound semiconductor material wherein N and other V-group elements (As, P, etc.) are intermixed, as well as to provide a semiconductor device having superior characteristics. Furthermore, a method of fabricating such a crystal is also provided.

A semiconductor device according to the present invention has a III–V compound semiconductor layer comprising, as V-group components, nitrogen and antimony, and one or more V-group elements other than nitrogen and antimony.

In this way, antimony (Sb) is intentionally taken as a component of the III–V compound semiconductor layer, whereby it has become possible to vary the combination of the mole fractions of the respective components in a predetermined wavelength and strain amount, in particular, possible to design the mole fractions in a manner so as to reduce the N mole fraction. Thus, a semiconductor device having better characteristics (light-emitting characteristics, in particular) is obtained.

In a preferred embodiment, an Sb mole fraction y (0<y<1) in the V-group components of the III–V compound semiconductor layer is 0.02 or more.

Due to the effect of bandgap bowing in conjunction with addition of Sb at a mole fraction y of 0.02 or more but less than 1, it is possible to obtain a mixed crystal having the desired bandgap width and strain amount with a smaller N mole fraction, compared with the conventional case.

In one preferred embodiment, the semiconductor device has a further III–V compound semiconductor layer adjacent the first III–V compound semiconductor layer, wherein a band discontinuity value between conduction bands of the first III–V compound semiconductor layer and of the further III–V compound semiconductor layers is 250 meV or more.

Preferably, the further III–V compound semiconductor layer may be a III–V compound semiconductor selected from GaAs, or any of AlGaAs, GaInP and InGaAsP that generally lattice-match with GaAs. Furthermore, the III–V compound semiconductor layer, preferably, emits light at a wavelength of about 1.3 μm, and an Sb mole fraction y of the layer satisfies:

$$y \leq -0.01\epsilon + 0.173 \ldots \quad (1)$$

where $\epsilon$ is a strain amount (%)

In the semiconductor device (light-emitting device in particular) utilizing a heterojunction, if the discontinuity value of the conduction band is 250 meV or more, or if the Sb mole fraction satisfies the relationship (1), it is possible to achieve better characteristics (temperature characteristics in a light-emitting element in particular), in spite of inclusion of Sb.

In a preferred embodiment, the III–V compound semiconductor layer contains Al as a III-group component.

In a preferred embodiment, an antimony content included in the III–V compound semiconductor layer is in an amount of more than required for canceling an increase of a bandgap width due to aluminum (Al).

In a preferred embodiment, a V-group element other than nitrogen and antimony in the III–V compound semiconductor layer is arsenic.

In preferred embodiment, the III–V compound semiconductor layer constitutes an active layer, more particularly, a well layer of a semiconductor laser element, and, when the semiconductor laser element has an infinite resonator length, a threshold current density thereof is not more than 0.3 kA/cm$^2$.

A crystal growth method, according to the present invention, for forming a III–V compound semiconductor layer comprising a III–V compound semiconductor layer containing, as a V-group components, nitrogen, antimony, and one or more V-group elements other than nitrogen and antimony, and containing indium as a III-group component, has:

process A of simultaneously supplying a plurality of sources containing at lest indium, and process B of simultaneously supplying a plurality of sources not containing indium but containing antimony, a cycle including the process A and the process B being repeated at least once to perform crystal growth.

In this crystal growth method, the In sources and the Sb sources are supplied at different times (namely, the supply process is separated into process A and process B), whereby it is possible to avoid deterioration of the efficiency of including Sb in an mixed crystal comprising In, and deterioration of crystallinity.

The cycle may further include process C of supplying a source not comprising indium or antimony to form a layer not comprising indium or antimony.

By the presence of the layer not comprising In or Sb formed in process C, the layer comprising In formed in process A and the layer comprising Sb formed in process B are not in direct contact with each other. Therefore, the problem of non-miscibility at the interface between the latter two layers, which is liable to occur in the case where process A and process B are continuously performed, is avoided The cycle may include process D of supplying a source not comprising indium or antimony to form a layer not comprising indium or antimony after a latter one of the processes A and B In this case, the layer not comprising In or Sb formed in process D makes it possible to suppress segregation or demixing of In and thermal volatilization of Sb.

The layers not comprising indium or antimony formed in process C and process D are, preferably, of GaAs Also, the layers not comprising indium or antimony formed in process C and process D have a layer thickness of one-molecular layer or more and not more than two-molecular layer. With the film thickness like this, it is possible to cover an underlying layer completely, and moreover it is possible to suppress the influence on the whole crystal composition to a minimum.

The N sources may be supplied in the process A or the process B. In place of this, or in addition to this, the cycle may further include process E of supplying sources of constituent elements not comprising III-group element sources but comprising an N source or sources. Further, the N source(s) may be supplied in every process included in the cycle.

When the cycle includes process E, the cycle may further include process F of supplying sources of constituent elements including an Al source before the process E. This is particularly effective in the case where a source, such as ammonia, which is not so high in the efficiency of thermal decomposition, is used as the N source. By performing process F before process E, it is possible to enhance the efficiency of using the sources of N.

BRIEF DESCRIPTION OF DRAWINGS

FIG. 7 is a perspective view of a semiconductor laser device;

FIG. 8 is a perspective view of a semiconductor laser device;

DETAILED DESCRIPTION (Embodiment 1)

Figure 1:
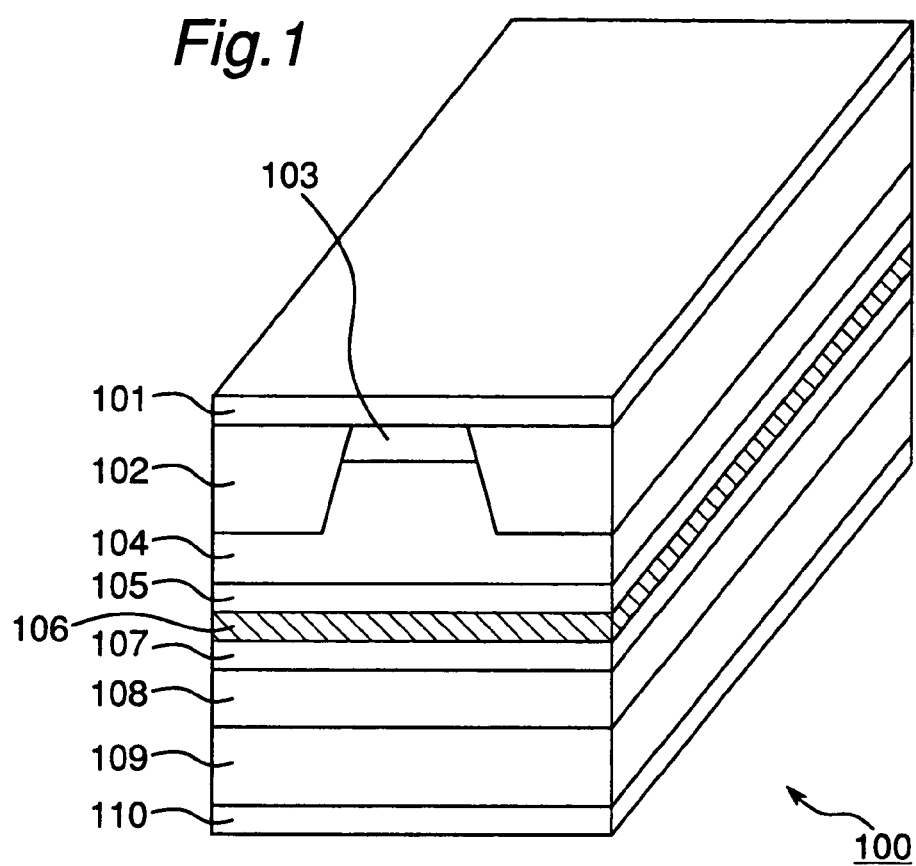
FIG. 1 is a perspective view of a semiconductor laser device.

FIG. 1 shows a semiconductor laser element 100 that is one embodiment of a semiconductor device according to the present invention. This semiconductor laser element 100 is formed on a GaAs substrate and designed to perform a lasing operation at a wavelength of 1.3 μm. The construction shown in FIG. 1 is characterized in that an optimized amount of Sb is included in a compound semiconductor layer constituting a well layer 106 that is an active layer. The details of each portion are as follows:

p-type electrode metal 101 . . . AuZn
current contraction layer 102 . . . polyimide
contact layer 103 . . . p-type GaAs, 0.5 μm
upper cladding layer 104 . . . p-type $Al_{0.4}Ga_{0.6}As$, 1 μm
upper guide layer 105 . . . i (intrinsic)-GaAs, 0.1 μm
well layer 106 . . . i-$Ga_{0.7}In_{0.3}N_{0.004}As_{0.951}Sb_{0.045}$, 7 mm, strain amount of 2.4%
lower guide layer 107 . . . i-GaAs, 0.1 μm
lower cladding layer 108 . . . n-type $Al_{0.4}Ga_{0.6}As$, 1 μm
substrate 109 . . . n-type GaAs
n-type electrode metal 110 . . . AuGe Layers from the lower cladding layer 108 through the contact layer 103 are crystal-grown on the GaAs (100) substrate 109 using a molecular beam epitaxy (MBE) method. In the MBE method used here, as sources of the elements (Al, Ga, In, As, Sb) excluding N, solid sources (metal Al, metal Ga, metal In, metal As, metal Sb) were used. Nitrogen gas excited by RF plasma was used as a nitrogen source. After the crystal growth by the MBE method, part of the upper cladding layer 104 was etched to a 2-μm wide stripe-shape to form a ridge-shaped waveguide structure. The polyimide current contraction layer 102 was formed on side surfaces of the ridge. The electrodes 101, 110 were formed at the top and bottom. Subsequently, end-face mirrors were formed in a direction perpendicular to that of the ridge by cleavage.

The semiconductor laser element 100 performed lasing at a wavelength of 1.3 μm. The threshold current density $J_{th}$ at the start of the lasing in the case where the resonator length (L) was set to 300 μm was 0.4 kA/cm², indicating that lasing was observed at a low current. The characteristic temperature $T_0$ in which the device temperature was in the range between 20° C. and 90° C. was 187 K, which means that the semiconductor laser element had good temperature characteristics.

Figure 2:
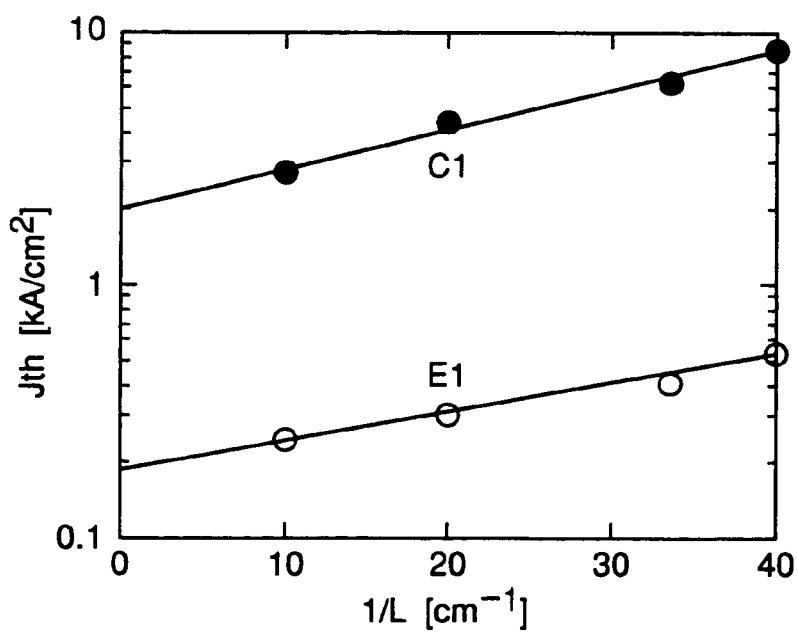
FIG. 2 is a view showing the correlation between the threshold current density and the resonator length.

FIG. 2 shows the relationship between the threshold current density $J_{th}$ and the resonator length L of this semiconductor laser. For comparison, values of a semiconductor laser element of Comparative Example 1 described later are also shown. In FIG. 2, E1 shows Embodiment 1, and C1 shows Comparative Example 1. As is apparent from FIG. 2, the threshold current density $J_{th}$ Of the semiconductor laser element of Embodiment 1 extrapolated when L converges to infinity (L→∞) (that is, 1/L→0) was 0.19 kA/cm².

(Embodiments 2 and 3)

Semiconductor lasers wherein the well layer 106 of the semiconductor laser structure described in detail in Embodiment 1 was replaced with:

i-$Ga_{0.67}In_{0.33}N_{0.0052}As_{0.9748}Sb_{0.02}$, 7 nm, strain amount of 2.4% in Embodiment 2, and i-$Ga_{0.735}In_{0.265}N_{0.0032}As_{0.9218}Sb_{0.075}$, 7 nm, strain amount of 2.4% in Embodiment 3 were fabricated. The details such as the fabricating process are the same as those of Embodiment 1, however, the mole fractions of the respective elements of the well layer are different.

As for the semiconductor laser elements also, the fabricating method and the width of the ridge are the same as those of Embodiment 1.

Both of the semiconductor laser elements oscillated at a wavelength of 1.3 μm. The threshold current densities $J_{th}$ of the semiconductor laser elements at the resonator length of L→∞ were 0.3 kA/cm² in Embodiment 2, and 0.22 kA/cm2 in Embodiment 3, respectively, indicating that lasing at a low current was observed in both embodiments. The characteristic temperatures $T_o$ at the temperature ranging from 20° C. to 90° C. were 182K and 180 K in Embodiment 2 and Embodiment 3, respectively, and thus the semiconductor laser elements had good temperature characteristics.

(Comparative Example 1)

A semiconductor laser wherein the well layer 106 of the semiconductor laser structure described in detail in Embodiment 1 was replaced with:

i-$Ga_{0.65}In_{0.35}N_{0.006}As_{0.99}$, 7 nm, strain amount of 24% was fabricated. The details such as the fabricating method are the same as those of Embodiment 1, except that Sb is not intermixed as in the prior arts.

As for the semiconductor laser element also, the fabricating method and the width of the ridge are the same as those of Embodiment 1.

This semiconductor laser element also oscillated at a wavelength of 1.3 μm. The characteristic temperature $T_o$ in which the temperature of the element was in the range between 20° C. and 90° C. was 183 K.

FIG. 2 shows the relationship between the threshold current density $J_{th}$ and the resonator length L. The threshold current density $J_{th}$ extrapolated for 1/L→0 was 2.0 kA/cm².

(Comparative Example 2)

A semiconductor laser wherein the well layer 106 of the semiconductor laser structure described in detail in Embodiment 1 was replaced with i-$Ga_{0.70}In_{0.24}N_{0.0022}As_{0.8978}Sb_{0.1}$, 7 nm, strain amount 2.4% was fabricated. The details such as the fabricating method are the same as those of Embodiment 1, except that the mole fractions of the respective elements of the well layer are different.

As for the semiconductor laser element also, the fabricating method and the width of the ridge are the same as those of Embodiment 1.

This semiconductor laser element also oscillated at a wavelength of 1.3 μm. The threshold current density $J_{th}$ of the semiconductor laser element at the resonator length of (L→∞) was 0.19 kA/cm². The characteristic temperature $T_0$ in which the temperature of the element was in the range between 20° C. and 90° C. was 120 K.

With reference to Embodiments 1 to 3 and Comparative Examples 1, 2, the functions and effects of the present invention will be described.

In Comparative Example 1, by intermixing 35% of In and 0.6% of N with GaAs, the baudgap width of the semiconductor layer is reduced to be adjusted to 0.96 eV, which is a bandgap width where light is emitted at a wavelength of 1.3 μm. In the case where In is intermixed with GaAs, the bandgap width becomes narrower than that of GaAs, and the lattice constant becomes greater. On the other hand, in the case where N is intermixed, not only does the bandgap width becomes narrower than that of GaAs, but also the lattice constant becomes smaller. By adding indium and nitrogen to GaAs to thereby narrow the bandgap width, a combination of the mole fractions is determined so that a semiconductor laser element emits light at a predetermined wavelength and that the lattice constant becomes significantly greater than that of GaAs and thus the lattice is strained. Consequently, a crystal defect is liable to occur. Thus, an upper limit of the In mole fraction is determined by a set value of the strain amount.

On the other hand, as described above, as the N mole fraction increases, there is a problem of rapid deterioration of the light emission characteristics. The upper limit of the N mole fraction is determined in consideration of the problem. Considering the limitations of the mole fractions, the bandgap width of the mixed crystal material GaInNAs is adjusted to a light-emitting wavelength of 1.3 μm. As a result, the well layer of Comparative Example 1 is formed. In the case of Comparative Example 1, the strain amount is 2.4%. Usually, the strain amount of the well layer is optionally set in the range of about 0 to +3% considering other characteristics.

While Comparative Example 1 consists of four elements of Ga, In, N, As, Embodiments 1 to 3 and Comparative Example 2 are characterized in that at least 2% of Sb is further included. Antimony has almost the same atomic radius as indium, and similar to indium, when intermixed with GaAs, antimony acts to reduce the bandgap width and increase the lattice constant. The inventor of the present application attempted to reduce the In mole fraction in a conventional GaInNAs mixed crystal, and to add antimony, in place of the reduced indium. As a result, the inventor has found that an mixed crystal having a desired bandgap width is obtainable even if the N mole fraction is reduced compared with the conventional case.

Figure 3A:
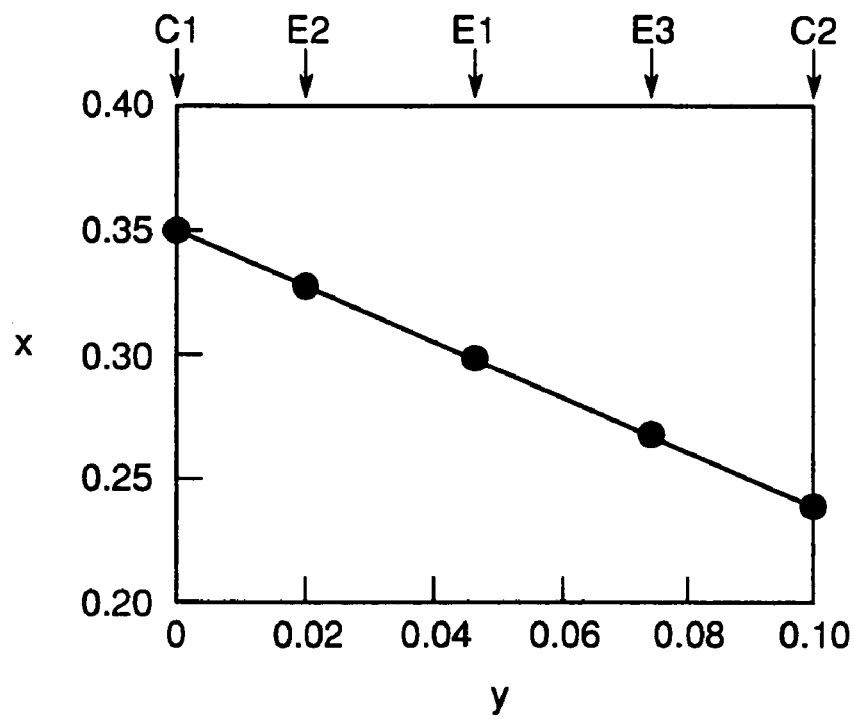
FIGS. 3A and 3B are views showing the correlation between the Sb mole fraction y and the In mole fraction x, and that between the Sb mole fraction y and the N mole fraction z, respectively, in GaInNAsSb.
Figure 3B:
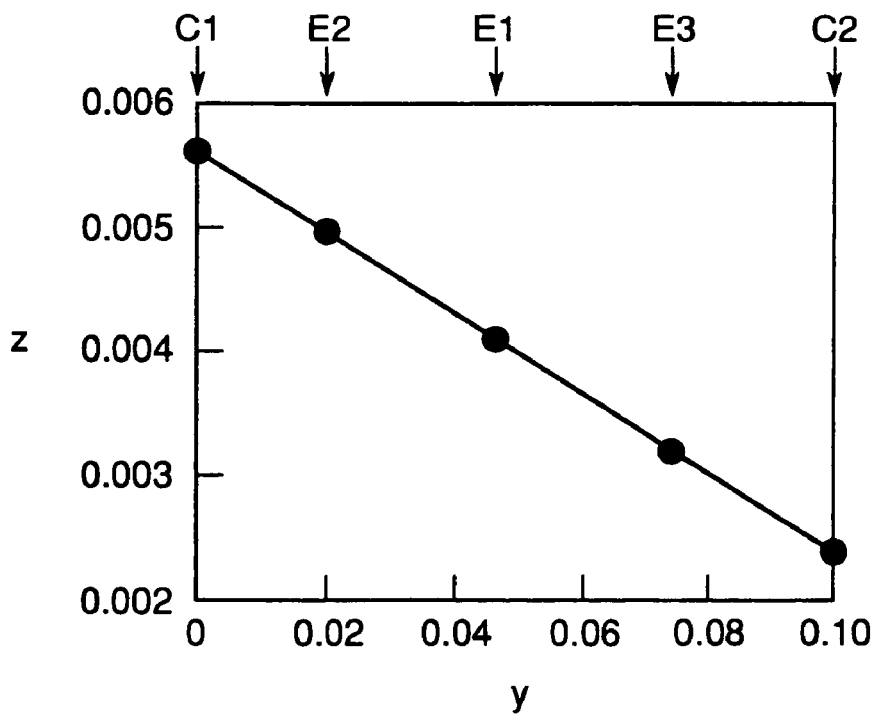

This is based on the following finding of the present inventor. That is, in the case where several to several tens % of Sb is included in GaINAs, instead of reducing the In mole fraction, an effect of bandgap width reduction effect due to bandgap bowing in conjunction with addition of antimony is obtained, and thus a crystal with a predetermined narrow bandgap width can be obtained even if the N mole fraction is small. That is, the above finding is based on the phenomenon that in the GaInNAsSb mixed crystal, antimony has a greater effect of reducing the bandgap width than indium does. In order to show this more concretely, in FIG. 3A and FIG. 3B, relationships between the Sb mole fraction, the In mole fraction x, and the N mole fraction z are described by illustration. Plots on the drawings correspond to the compositions of Embodiments 1 to 3 (represented by E1, E2 and E3 in the figures) and Comparative Examples 1 and 2 (represented by C1 and C2 in the figures), respectively. As for the composition of each plot, both the light-emitting wavelength and the strain amount are kept at 1.3 μm and 2.4%, respectively. In FIG. 3A and FIG. 3B, the axis of abscissas represents the Sb mole fraction y, and the case of y=0 corresponds to Comparative Example 1.

In the case where antimony is intermixed with the GaIn-NAs mixed crystal of Comparative Example 1, as is apparent from FIG. 3A and 3B, In and N mole fractions x, z to obtain a mixed crystal having a light-emitting wavelength of 1.3 μm and a strain amount of 2.4% are shifted to decrease with the increased Sb mole fraction y. In particular, in the composition of Embodiment 1 in which 4.5% of antimony is contained, it Was found that the N mole fraction was reduced to two thirds of a case not including antimony (Comparative Example 1).

Figure 4:
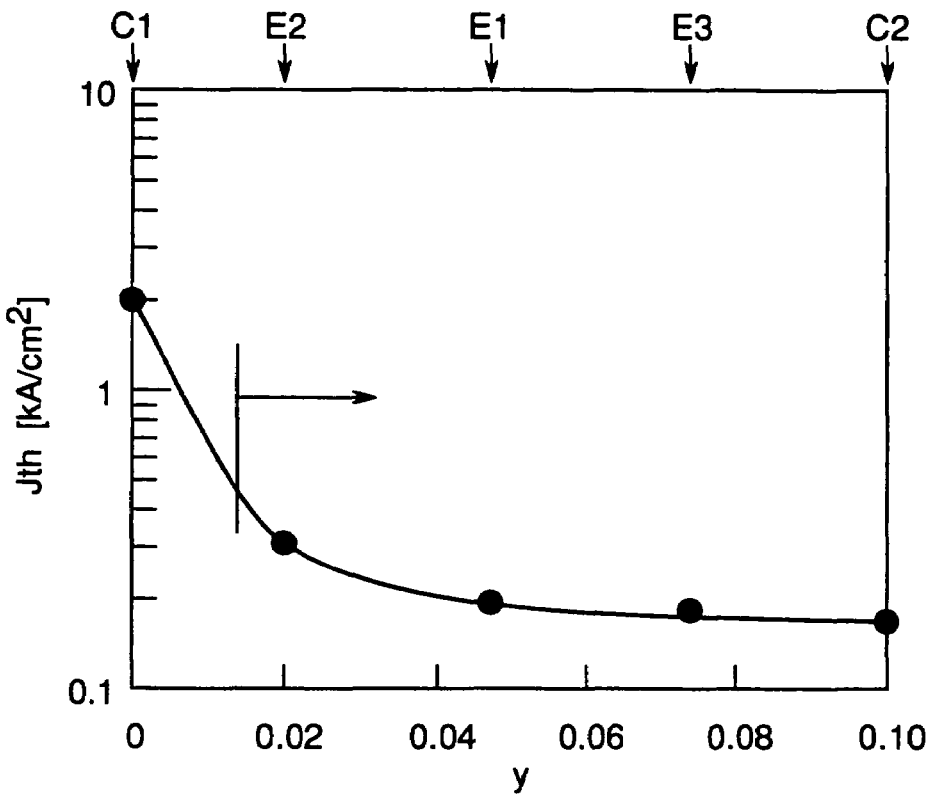
FIG. 4 is a view showing the correlation between the threshold current density and the Sb mole fraction.

FIG. 4 shows the threshold current densities $J_{th}$ extrapolated for 1/L→0, plotted as a function of the Sb mole fraction, of the semiconductor lasers of Embodiments 1 to 3 (in the figure, represented by E1, E2, E3, respectively) and Comparative Examples 1, 2 (in the figure, represented by C1, C2, respectively). As described above, considering that when the Sb mole fraction increases, the light-emitting characteristics deteriorate exponentially, the composition of Embodiment 1 wherein Sb has been intermixed to reduce the N mole fraction to ⅔ leads to a remarkable improvement in the light-emitting characteristics. This leads to a reduction in the lasing threshold current density of the semiconductor laser element and further leads to an improvement in the lasing efficiency. In particular, FIG. 4 reveals that if the Sb mole fraction is set to 2% or more, the lasing threshold current density can greatly be reduced in comparison with that of Comparative Example 1. It turns out that the addition of antimony makes it possible to fabricate a superior semiconductor laser having a lasing threshold current density of not more than 0.3 kA/cm² for the first time.

Figure 5A:
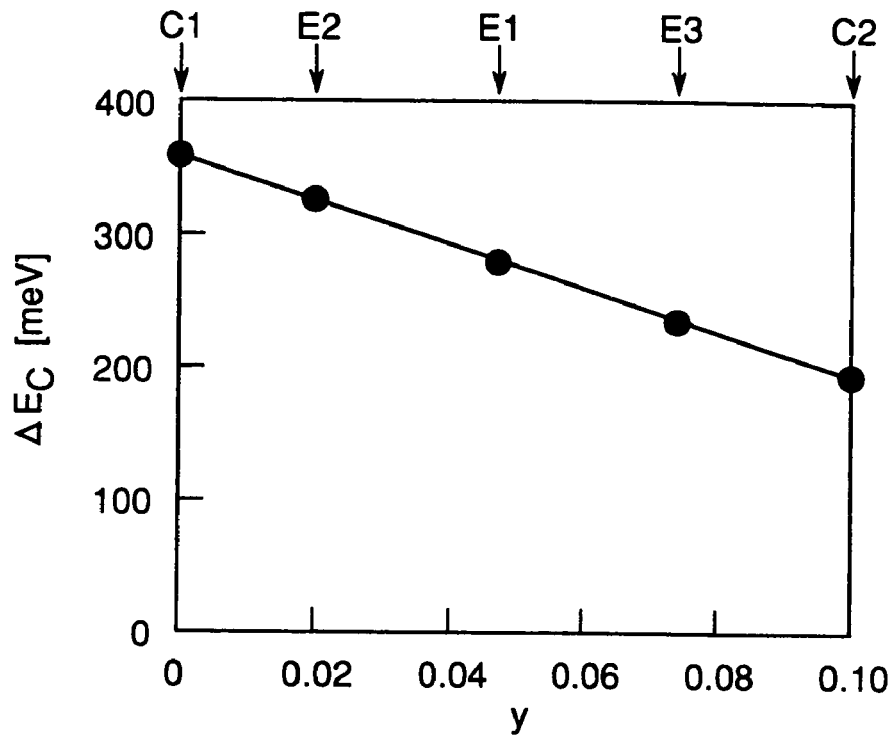
FIG. 5A and FIG. 5B are views showing the correlation between the Sb mole fraction y and ΔEc in a hetero junction, and that between that Sb mole fraction y and the characteristic temperature $T_0$, respectively.
Figure 5B:
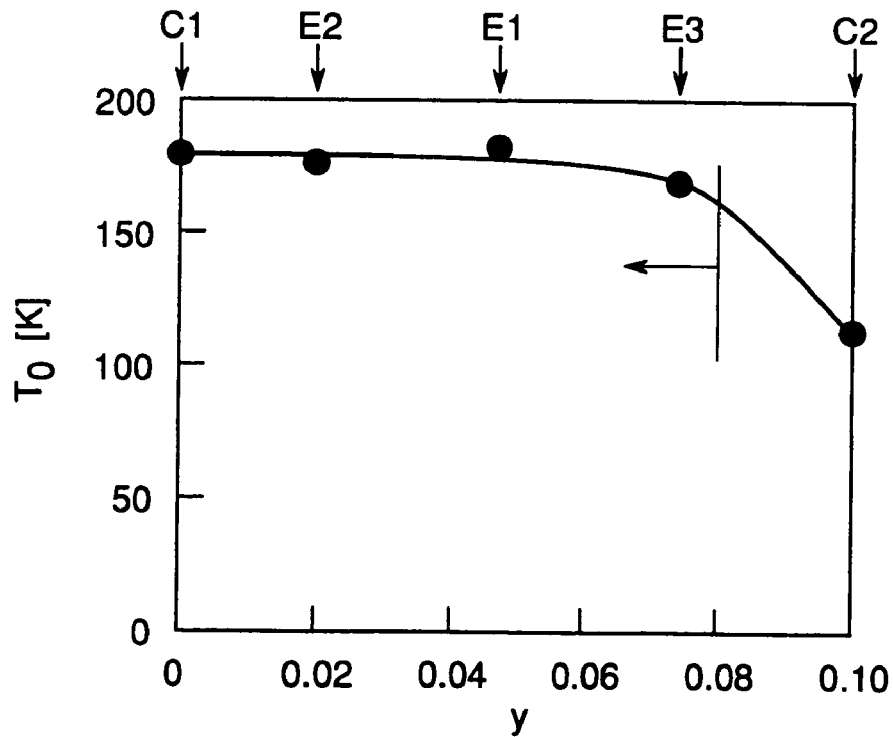

Further, it seems that if the Sb mole fraction is further increased, the wavelength of 1.3 μm can be realized with a further reduced N mole fraction thereby obtaining the better characteristics. However, it has been found that an increase of the Sb mole fraction and a decrease of the In and N mole fractions reduce a conduction band energy difference ΔEc in a heterojunction with a barrier layer (in FIG. 1, the upper guide layer 105 and lower guide layer 107 function as the barrier layers), and therefore that a drawback of weakening the confinement of electrons into the well layer occurs. FIG. 5A and FIG. 5B show the correlations among the Sb mole fraction y and ΔEc and the characteristic temperature $T_0$ in a hetero junction between $Ga_{1-x}In_xN_zAs_{1-y-z}Sb_y$ having a light-emitting wavelength of 1.3 μm and a strain amount of 2.4% and GaAs used as the barrier layers.

When the Sb mole fraction y indicated by the axis of abscissas is changed, the In mole fraction x and the N mole fraction z are changed according to the correlations shown in FIG. 3A and FIG. 3B so that the bandgap width of the mixed crystal material and the strain amount thereof are kept constant. The addition of antimony reduces ΔEc and weakens the confinement of electrons into the well layer. But, FIG. 5A and FIG. 5B indicate that if the Sb mole fraction is not more than 7.5%, ΔEc of 250 meV or more is obtained, in which case $T_0$ is kept at 180K or more. As shown in Comparative Example 2, the Sb mole fraction is set to higher than 7.5%, $T_0$ drastically decreases, which is not preferred (Comparative Example 2). As is apparent from this, it is required that the Sb mole fraction be set within an appropriate range depending on the extent of band discontinuity between the mixed crystal layer and the barrier layer.

(Embodiments 4 and 5)

Semiconductor lasers wherein the well layer 106 of the semiconductor laser structure of Embodiment 1 was replaced with:

i-$Ga_{0.817}In_{0.183}N_{0.0065}As_{0.8985}Sb_{0.095}$, 7 nm, strain amount of 1.9% in Embodiment 4, and i-$Ga_{0.95}In_{0.05}N_{0.0122}As_{0.8598}Sb_{0.128}$, 7 nm, strain amount of 1.1% in Embodiment 5 were fabricated. The details such as the fabricating process are the same as those of Embodiment 1, however, the mole fractions of the respective elements of the well layer are different.

In these semiconductor laser element also, the fabricating method, the width of the ridge and the resonator length are the same as those of Embodiment 1.

Both of the semiconductor laser elements oscillated at a wavelength of 1.3 μm. The threshold current densities $J_{th}$ at the start of the lasing operation in the case where the resonator length L was 300 μm were 0.39 kA/cm$^2$ and 0.42 kA/cm$^2$ in Embodiment 4 and Embodiment 5, respectively, indicating lasing a low current was observed. The characteristic temperatures $T_0$ at a device temperature ranging from 20° C. to 90° C. were 188 K and 181 K in Embodiment 4 and Embodiment 5, respectively, and thus they had good temperature characteristics.

With all of the well layers of the semiconductor laser elements of Embodiment 4 and Embodiment 5 and Embodiment 3, the wavelength is 1.3 μm. In those embodiments, the composition of the well layer is set so that a conduction band energy difference Δ Ec between the well layer and the GaAs barrier layers in each of the semiconductor elements is 250 meV, but their strain amounts are different. As is described in Embodiments 1 to 3 with reference to FIG. 5A, in the case where Sb is intermixed with GaInNAs, the conduction band energy difference ΔEc between the well layer and the barrier layers decreases with the increase of the Sb mole fraction, therefore, there is an optimal range of the Sb mole fraction for a proper value ΔEc. The optimal range of the Sb mole fraction depends on the combination of factors such as the bandgap width of the barrier layers, the bandgap width of the GaInNAsSb mixed crystal, the In mole fraction, and the N mole fraction.

Figure 6:
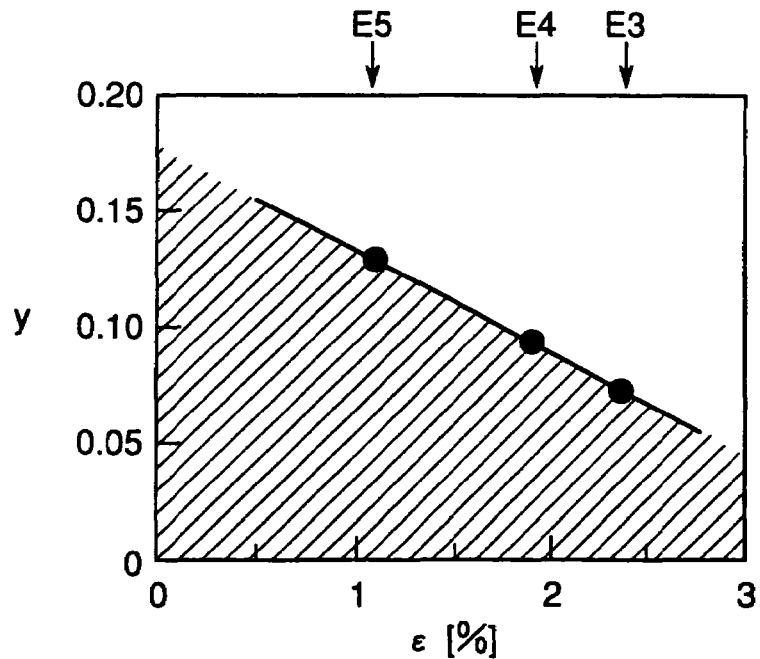
FIG. 6 is a view showing the correlation between the strain amount ϵ (%) of a mixed crystal and the upper limit of the Sb mole fraction.

However, the inventor of the present application found that the optimal range of the Sb mole fraction can be expressed as a function of the strain amount of a mixed crystal if the materials of the barrier layers and the bandgap width of the mixed crystal are fixed. FIG. 6 shows the relationship between the strain amount ε (%) of each structure in Embodiments 3 to 5 where GaAs is used as the barrier layers and the Sb mole fraction y. Since Embodiments 3 to 5 (in the figure, represented by E3 to E5) all have the wavelength of 1.3 μm and ΔEc=250 meV, the line connecting the dots in FIG. 6 shows the dependence of the upper limit value of the Sb mole fraction y on the strain amount ε. The line connecting the dots in FIG. 6 can generally be approximated by:

$y=0.041\epsilon+0.173$.

Sb mole fractions y having a value not more than that given by this line can be expressed by:

$y \leq -0.041\epsilon+0.173$. . . . Expression (1), where 0<y<1. If a mixed crystal is fabricated in a region hatched with oblique lines, an mixed crystal wherein ΔEc is 250 meV or more can be fabricated and thus a semiconductor laser having superior temperature characteristics is obtained.

Although expression (1) is originally for the case where the barrier layers are of GaAs, it is desirable that expression (1) is also satisfied in the case where the barrier layers are of AlGaAs, GaInP or InGaAsP. The reason for that is as follows. In the case where the barrier layers are of AlGaAs, because the conduction band energy level of AlGaAs is higher than that of GaAs, it is certain that ΔEc≧250 meV is secured if relationship (1) is satisfied. As for the GaInP and InGaAsP that generally lattice-match with GaAs, the conduction band energy level is the same as that of GaAs. Thus, if they similarly satisfy equation (1), ΔEc≧250 meV is secured.

(Embodiment 6)

FIG. 7 shows a semiconductor laser element 700 that is one embodiment of the semiconductor device of the invention of the present application. This semiconductor laser element 700 is characterized by being designed to perform a lasing operation at a wavelength of 1.55 μm. The details of each portion are as follows.

p-type electrode metal 701 . . . AuZn
first current contraction layer 702 . . . n-type $Al_{0.6}Ga_{0.4}As$
second current contraction layer 703 . . . p-type $Al_{0.6}Ga_{0.4}As$
third current contraction layer 704 . . . n-type $Al_{0.6}Ga_{0.4}As$
contact layer 705 . . . p-type GaAs, 0.5 μm
upper cladding layer 706 . . . p-type InGaP, 1 μm
well layer 708 . . . i-$Ga_{0.83}In_{0.17}N_{0.01}As_{0.82}sb_{0.17}$, 7 mm,
lower guide layer 709 . . . i-GaAs, 0.1 μm
lower cladding layer 710 . . . n-type InGaP, 1 μm
substrate 711 . . . .n-type GaAs
n-type electrode metal 712 . . . AuGe Layers from the lower cladding layer 710 through the contact layer 705 were fabricated through crystal growth on the GaAs (100) substrate 711 using a metal organic chemical vapor deposition (MO-CVD) method. In the MO-CVD method used here, as sources of the elements (Ga, In, Sb, N) excluding As and P, organic metals (trimethyl gallium, trimethyl indium, trimethyl antimony, dimethyl hydrazine) were used. Arsine and phosphine were used as the arsenic source and the phosphorus source, respectively. The MO-CVD method was performed in an atmosphere of hydrogen carriers under reduced pressure of 76 torr at a substrate temperature of 550° C. After the crystal growth by the MO-CVD method, the grown layers were etched into a 1.5-μm wide stripe-like mesa shape to form a waveguide structure. Layers from the third current contraction layer 704 through the first current contraction layer 702 were grown on side surfaces of the mesa by the MO-CVD method again. Thereafter, the electrodes 712, 701 were formed at the top and bottom, respectively. Subsequently, end-face mirrors were formed in a direction perpendicular to that of the mesa by cleavage. The resonator length (i.e., an interval between the end-face mirrors) was set to 250 μm.

The semiconductor laser element 700 performed lasing at a wavelength of 1.55 μm. The threshold current density at the start of the lasing was 0.55 A/cm$^2$, and the characteristic temperature $T_0$ at a device temperature ranging from 20° C. to 90° C. was 205 K. In this way, even with the different wavelength, inclusion of 2% or more of Sb has made it possible to fabricate a semiconductor laser element having better characteristics than the case where Sb is not intermixed. Although Sb is intermixed, in hetero junctions with adjacent layers 707, 709, a large discontinuity value of $\Delta E_c$=300 meV of the conduction band is secured and thus the high temperature characteristics were obtained.

(Embodiment 7)

FIG. 8 shows a semiconductor laser element 800 that is one embodiment of the semiconductor device of the invention of the present application. This semiconductor laser element 800 is characterized in that an active layer has a multi-quantum well structure and that Al is further included in each well layer. The details of each portion are as follows.

p-type electrode metal 801 . . . AuZn
current concentration layer 802 . . . n-type $Al_{0.6}Ga_{0.4}As$
contact layer 803 . . . p-type GaAs, 0.5 μm
upper cladding layer 804 . . . p-type $Al_{0.04}Ga_{0.6}As$, 1 μm
upper guide layer 805 . . . i (intrinsic)-$Al_{0.05}Ga_{0.09}As$, 0.1 μm
well layer 806 . . . i-$Al_{0.05}Ga_{0.8}In_{0.15}N_{0.013}As_{0.887}Sb_{0.1}$, 8 nm, strain amount of 1.6%
barrier layer 807 . . . i(intrinsic)-$Al_{0.05}Ga_{0.09}As$, 0.1 μm
well layer 808 . . . i-$Al_{0.05}Ga_{0.8}In_{0.15}N_{0.013}As_{0.887}Sb_{0.1}$, 8 nm strain amount of 1.6%
lower guide later 809 . . . i-$Al_{0.05}Ga_{0.09}As$, 0.1 μm
lower cladding layer 810 . . . n-type $Al_{0.4}Ga_{0.6}As$, 1 μm
substrate 811 . . . n-type GaAs
n-type electrode metal 812 . . . AuGe Layers from the lower cladding layer 810 through the contact layer 803 were fabricated through crystal growth on the GaAs (100) substrate 811 using a chemical beam epitaxy (CBE) method. In the CBE method used here, for sources of the elements (Al, Ga, In, Sb, N) excluding As and P, organic metals (trimethyl aluminum, trimethyl gallium, trimethyl indium, trimethyl antimony, ammonia) were used. Arsine and phosphine were used as As and P sources, respectively. The CBE method was performed at a substrate temperature of 480° C. After the crystal growth by the CBE method, the upper cladding layer 804 was etched into a 2.5-μm wide stripe-like mesa shape to form a ridge-type waveguide structure. The current contraction layer 802 was selectively grown on side surfaces of the ridge by the CBE method again. Thereafter, the electrodes 801, 812 were formed at the top and bottom, respectively. Subsequently, end-face mirrors were formed in a direction perpendicular to that of the mesa by cleavage. The resonator length (interval between the end-face mirrors) was set to 500 μm.

The semiconductor laser element 803 performed lasing at a wavelength of 1.3 μm. The threshold current density at the start of the lasing was 0.35 A/cm², and the characteristic temperature $T_0$ at the device temperature ranging from 20° C. to 90° C. was 195 K. In this way, even if Al is further intermixed with GaInNAsSb, a 2% or more antimony content has made it possible to achieve a semiconductor laser element having superior characteristics. Although Sb is intermixed, a large discontinuity value $\Delta E_c$=300 meV of the conduction band is secured in hetero junctions with adjacent layers 805, 807, 809, which means that the high temperature characteristics are obtained. Incidentally, a semiconductor laser element whose well layers are composed of AlGaIn-NAsSb is not limited to the one having a lasing wavelength of 1.3 μm, and the present invention is also applicable to a semiconductor laser having another wavelength of 1.55 μm and the like.

(Embodiment 8)

In the present embodiment, a method for forming a GaInNAsSb mixed crystal by intermittent supply of sources.

Figure 9A:
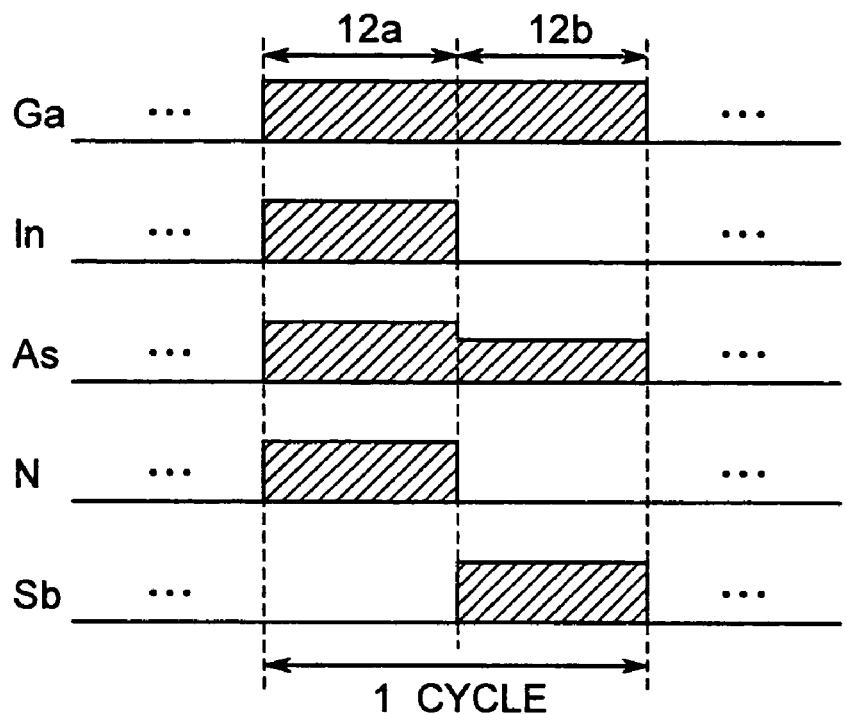
FIG. 9A and FIG. 9B are diagrams showing a sequence of supplying sources when growing GaInNAsSb.

Using respective solid metal sources as the III-group sources and arsine and antimony sources, and using $N_2$ gas activated by ECR plasmas as a nitrogen source, crystal growth was performed on a GaAs (100) substrate at a substrate temperature of 480° C. by the MBE method. FIG. 9A shows a sequence of one cycle of intermittent supply of the sources at the time of the crystal growth. The point of this sequence is that indium is not supplied while antimony is being supplied (process step 12b). One cycle of this sequence requires 4 seconds and the beam intensities of the sources are adjusted so that a $Ga_{0.8}In_{0.2}N_{0.01}As_{0.93}Sb_{0.06}$ mixed crystal corresponding to one-molecular layer is grown in one cycle consisting of process 12a and process 12b. More specifically, the gallium molecular beams were supplied at an intensity of $1.5\times10^{-7}$ torr, the indium molecular beams were supplied at an intensity of $3.0\times10^7$ torr, the arsenic molecular beams were supplied at an intensity of $1.0\times10^{-5}$ torr in the first half, and $0.8\times10^{-5}$ torr in the second half; the supply rate of nitrogen gas Was 0.5 cc/min; and the antimony molecular beams were supplied at an intensity of $5.0\times10^{-7}$ torr. This cycle was repeated 22 times to grow a mixed crystal, or alloy crystal, with a thickness of 62 nm.

This mixed crystal had a PL (photoluminescence) emission wavelength of 1.3 μm, and a full width at half maximum of 20 meV, which means that the emission intensity was extremely strong.

(Comparative Example 3)

For comparison, with the molecular beam intensities of the respective sources shown in Embodiment 8 as such, crystal growth of an mixed crystal was performed by supplying all the beams of the sources simultaneously. An intensity of arsenic molecular beams was set to $0.8\times10^{-5}$ torr. In this case, the Sb mole fraction of the mixed crystal that has been grown is 0.01, which is about ⅙ of that of Embodiment 8. Thus, it turns out that taking of Sb into the film becomes less. The PL emission intensity was 1/10 of that of Embodiment 8, and the half width was 37 meV.

The effect of the present invention is hereinafter described with reference to Embodiment 8 and Comparative Example 3.

The inventor of the present application found that in growing the GaInNAsSb mixed crystal, as the In mole fraction increases, the efficiency of taking Sb into the film remarkably deteriorates, which not only is a problem in terms of the usability of the sources, but also causes the light-emitting characteristics to deteriorate. The reason for this is assumed as follows. In an mixed crystal system including both indium and antimony, a non-miscible region is so large that it becomes difficult to take indium and antimony into the film at the same time.

Embodiment 8 was made in order to solve this problem. That is, the indium source and the antimony source are supplied at different times. Thus, at the time of supplying antimony, the efficiency of taking antimony into the film has greatly been improved because indium is not supplied then. Since crystal growth is performed while avoiding the problem of non-miscibility, a mixed crystal having superior light-emitting characteristics can be produced.

Although antimony is not supplied at all while indium is supplied in the FIG. 9A example, there is no problem even if antimony is supplied during the supply of indium (process 13a). At this time, antimony supplied together with indium is hard to take into the film, but it is sufficient if a sequence (process 13b) in which antimony is supplied in a state in which indium is not supplied is provided after that. Further, in Embodiment 8, gallium, arsine and nitrogen are supplied simultaneously with indium, and gallium and arsine are supplied simultaneously with antimony. However, the kinds of molecular beams of other sources that are to be supplied simultaneously with indium or antimony are not limited to the above combinations. For example, setting a sequence in which gallium and arsine are supplied simultaneously with indium, and gallium, arsine and nitrogen are supplied simultaneously with antimony, the sequence may be repeated. The thickness of a layer to be grown per cycle does not need to be one-molecular layer. It may be of any number of molecular layers such as a two-molecular layer, a five-molecular layer or more, or instead of a natural number, 1.5-molecular layer.

In Embodiment 8, although the substrate temperature is set to 480° C., the substrate temperature can be set as desired in the range between 400° C. and 500° C. If the substrate temperature is lower than 400° C., deterioration of light-emitting characteristics is observed. If the substrate temperature is higher than 500° C., it was difficult to achieve flat crystal growth.

(Embodiment 9)

Figure 10:
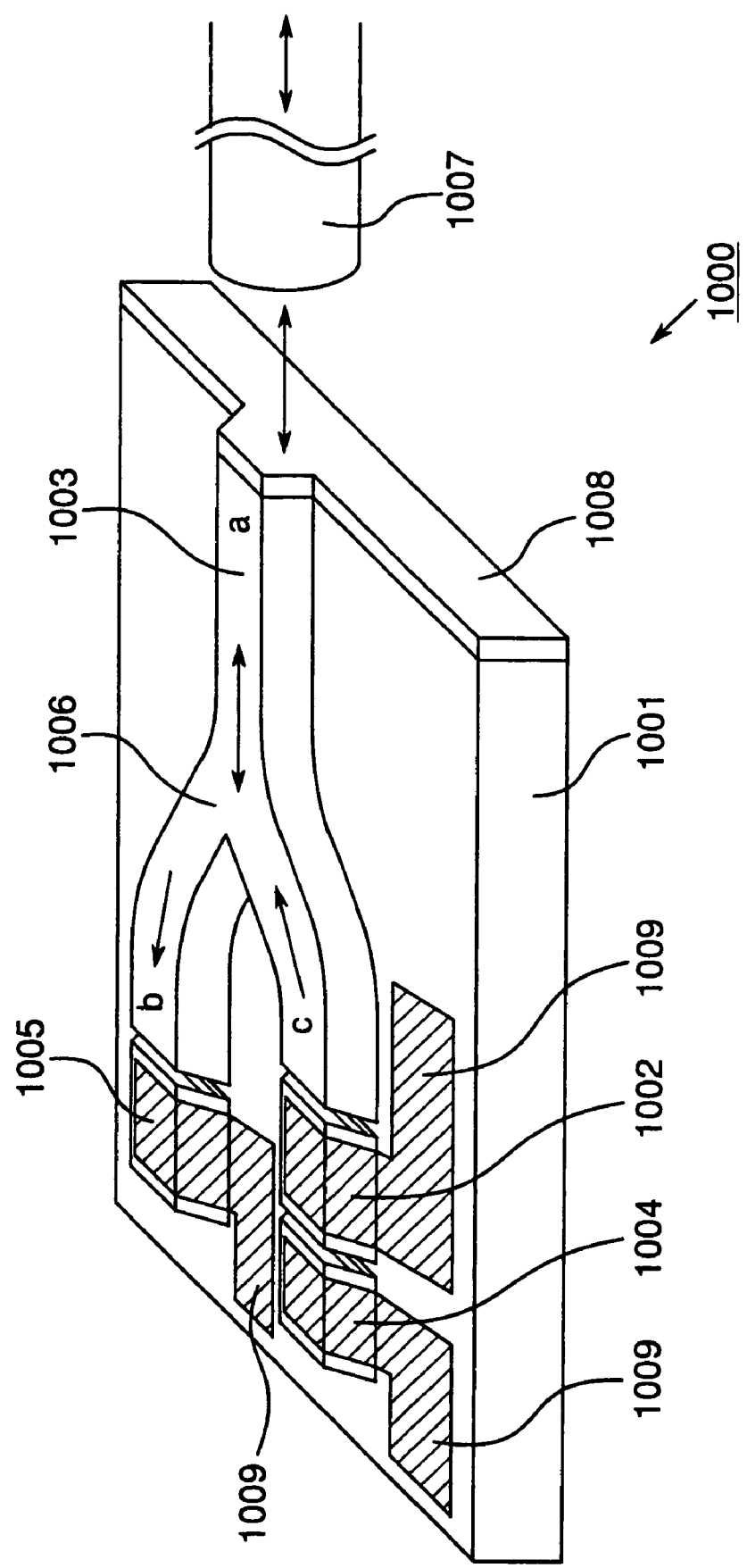
FIG. 10 is a perspective view of an optical transmission-reception module.

In FIG. 10, an optical transmission-reception module that is one embodiment of the semiconductor device of the present invention, which is used for an optical communication system, is described.

FIG. 10 shows a schematic view (perspective view) of the optical transmission-reception module 1000. An optical signal having a wavelength of 1.3 μm transmitted from a base station via an optical fiber 1007 is connected to an optical waveguide 1003 at point "a" to pass the optical waveguide 1003. The optical signal that has passed is branched at the ratio of 50 to 50, one of the branches passes point "b" to reach a light-receiving detector part 1005, where the transmitted optical signal is converted to an electrical signal. On the other hand, as for a transmitting function, an electrical signal is converted to an optical signal by a semiconductor laser part 1002. The converted optical signal is connected to the waveguide 1003 via point "c" to be transmitted to the optical fiber at point "a". An output monitoring part 1004 monitors an optical output of the semiconductor laser 1002 from backward.

The transmitting semiconductor laser part 1002, the light-receiving detector part 1005, the output monitoring part 1004 for the transmitting semiconductor laser, and the waveguide part 1003, which all constitute this optical light transmission-reception module 1000, are formed on a GaAs substrate 1001 by one-time crystal growth, and their respective fine elements are integrated monolithically. The layer structure of the transmitting semiconductor laser part 1002, the receiving detector part 1005, and the output monitoring part 1004 for the transmitting semiconductor laser is the same as that shown in Embodiment 1, and a semiconductor material comprising GaInNAsSb is used for a quantum-well active layer or a well layer being a core layer thereof to provide high performance. Zinc is thermally diffused to the waveguide part 1003 from an upper surface thereof to disorder the quantum-well structure of the core layer, so that it becomes transparent with respect to light with a wavelength of 1.3 μm. The individual fine elements are processed by dry etching and isolated from each other.

In this optical light transmission-reception module, a III–V compound semiconductor material containing arsine and nitrogen is used for the transmitting semiconductor laser part 1002, the light-receiving detector part 1005, the output monitoring part 1004 for the transmitting semiconductor laser. Further inclusion of antimony has reduced the power consumption in the semiconductor laser part and has greatly improved the light-electricity conversion efficiency in the detector monitoring part. Thus, an improvement in the performance of the whole system has been achieved.

In the present embodiment, the case where the same layer-structure as that described in Embodiment 1 is used has been described. It is needless to say that if a similar system is constructed using a combination of various elements, mole fractions and the like, which are shown in other embodiments, the system will have high performance.

In the above, an application to an optical fiber communication system is shown, but a similar construction can be used in other application systems such as space optical transmission systems without using any optical fibers, pickups for optical discs, optical measurement systems with a sensing function by light, and medical apparatuses using laser. It is a matter of course that the same effect can be obtained in the above systems. Furthermore, it goes without saying that the systems may not necessarily be of a monolithic type, and may be of a hybrid type wherein a semiconductor laser part and a light-receiving detector part are attached from the outside.

(Embodiment 10)

Figure 11:
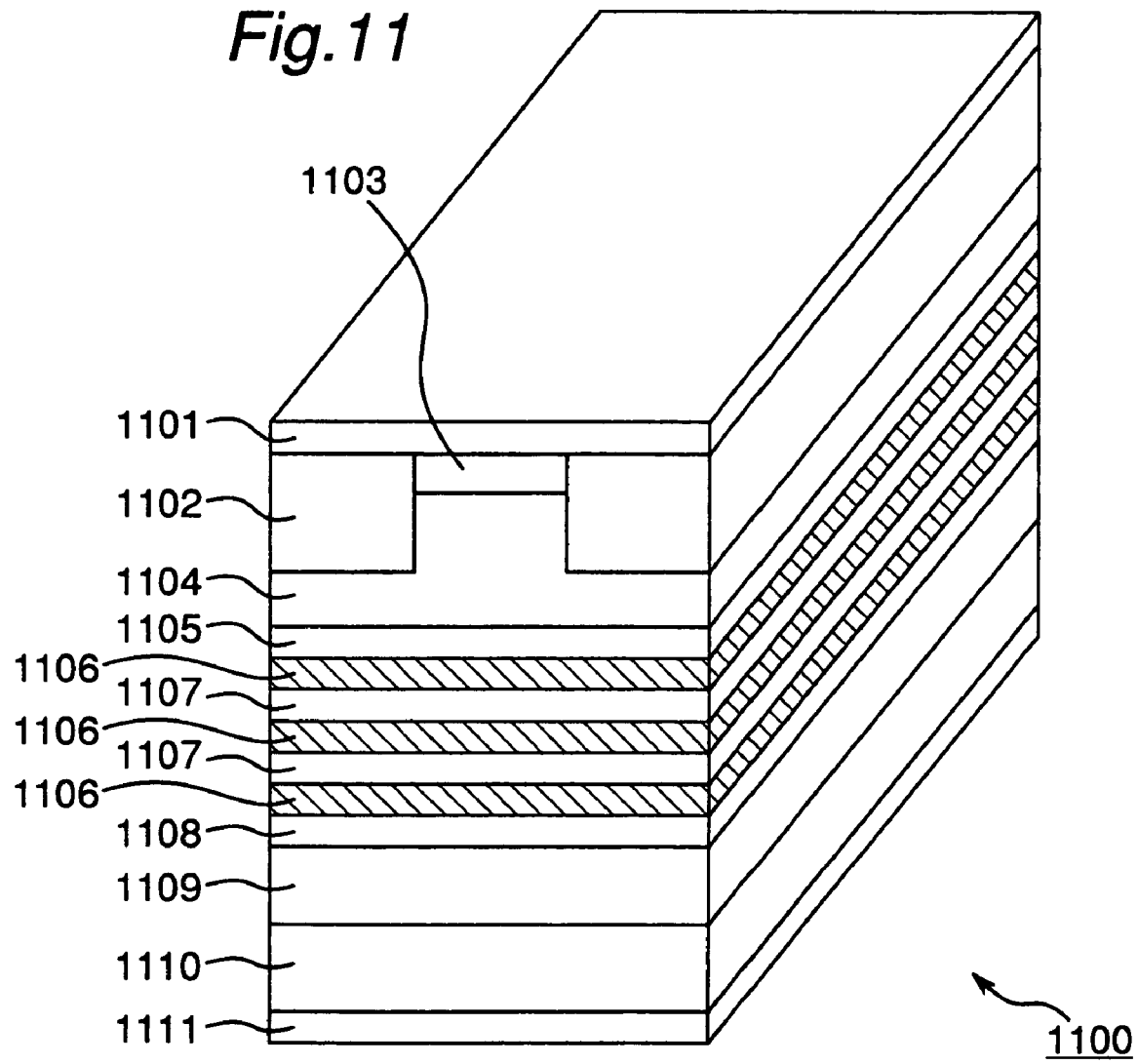
FIG. 11 is a perspective view of a semiconductor laser that is one embodiment of a semiconductor device of the present invention.

FIG. 11 shows a semiconductor laser element 1100 that is one embodiment of the semiconductor device of the invention of the present application. This semiconductor laser element 1100 is characterized in that an active layer has a multi-quantum well structure and that aluminum and antimony are contained in each active layer. The details of each portion are as follows.

p-type electrode metal 1101 . . . AuZn
current contraction layer 1102 . . . n-type $Al_{0.6}Ga_{0.4}As$
contact layer 1103 . . . p-type GaAs, 0.5 μm
upper cladding layer 1104 . . . p-type $Ga_{0.5}In_{0.5}P$, 1 μm
upper guide layer 1105 . . . i(intrinsic)-GaAs, 0.1 μm
well layers 1106 . . . $Al_{0.05}Ga_{0.95-x}In_xN_zAs_{1-y-z}Sb_y$, 7 nm
barrier layers 1107 . . . i-GaAs, 0.05 μm
lower guide layer 1108 . . . i-GaAs, 0.1 μm
lower cladding layer 1109 . . . n-type $Ga_{0.5}In_{0.5}P$, 1 μm
substrate 1110 . . . n-type GaAs
n-type electrode metal 1111 . . . AuGe Layers from the lower cladding layer 1109 through the contact layer 1103 are crystal-grown on the GaAs (100) substrate 1110 using the molecular beam epitaxy (MBE) method. In the MBE method used here, as sources of respective elements (Al, Ga, In, As, P, Sb) excluding N, solid metals were used. Ammonia gas ($NH_3$) was used as a nitrogen source. The MBE method was performed at a substrate temperature of 460° C. After the crystal growth by the MBE method, the upper cladding layer 104 was etched into a 2 μm-wide stripe-like mesa shape to form a ridge-shaped waveguide structure. The current contraction layer 1102 was selectively formed on side surfaces of the ridge by the MBE method again. After that, the electrodes 1101, 1111 were formed at the top and bottom. Subsequently, end-face mirrors were formed in a direction perpendicular to that of the mesa by cleavage. The resonator length (distance between the end-face mirrors) was set to 300 μm.

Figure 12:
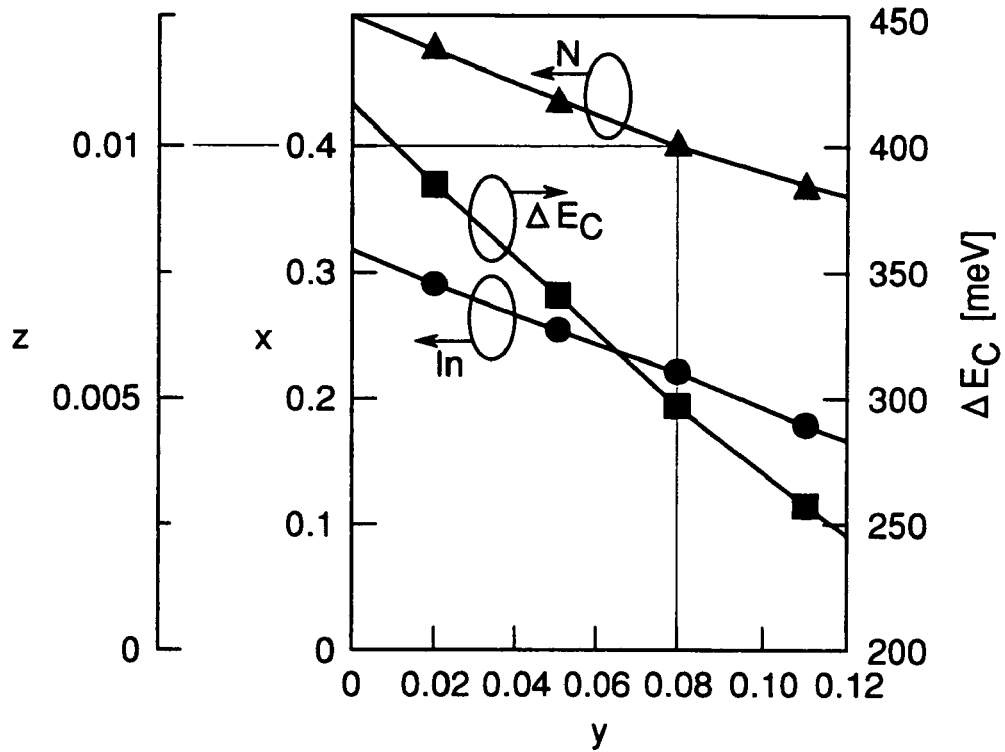
FIG. 12 illustrates, as a function of the Sb mole fraction y, combinations of mole fractions in $Al_{0.05}Ga_{0.95-x}In_xN_zAs_{1-y-z}Sb_y$, in the case where the light-emitting wavelength is 1.3 μm and the strain amount is 2.0%, and further shows a discontinuity value $\Delta E_c$ of the conduction band between the $Al_{0.05}Ga_{0.95-x}In_xN_zAs_{1-y-z}Sb_y$ layer and an adjacent GaAs barrier layer.
Figure 13:
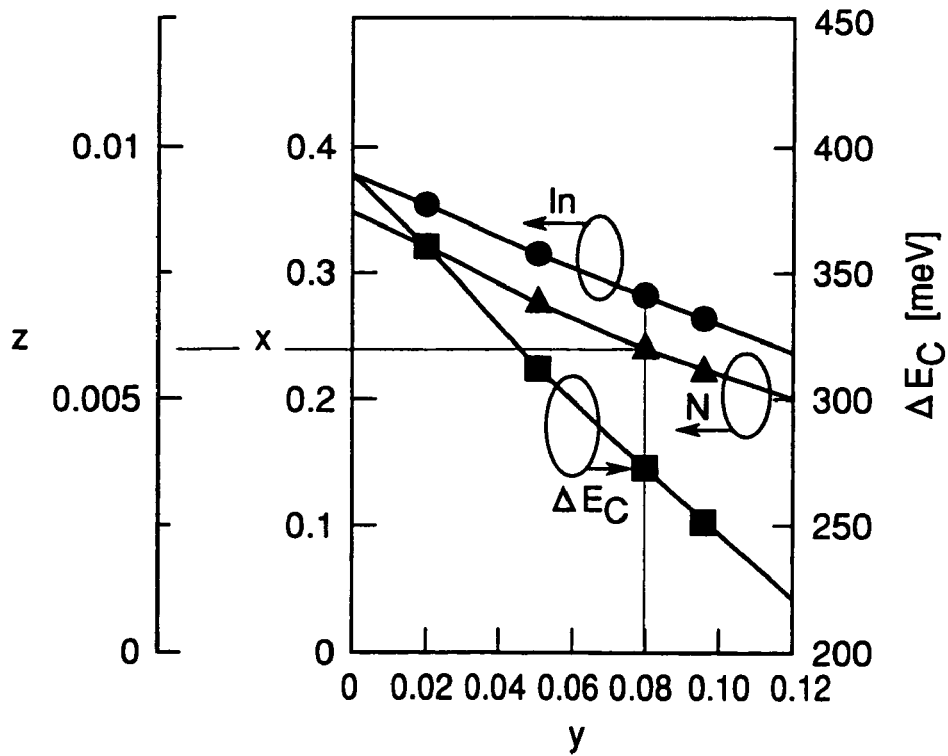
FIG. 13 illustrates, as a function of the Sb mole fraction y, combinations of mole fractions in $Al_{0.05}Ga_{0.95-x}In_xN_zAs_{1-y-z}Sb_y$, in the case where the light-emitting wavelength is 1.3 μm and the strain amount is 2.5%, and further shows a discontinuity value $\Delta E_c$ of the conduction band between the $Al_{0.05}Ga_{0.95-x}In_xN_zAs_{1-y-z}Sb_y$ layer and an adjacent GaAs barrier layer.

For the composition of the well layers of i-$Al_{0.5}Ga_{0.95-x}In_xN_zAs_{1-y-z}Sb_y$, selection was made of eight combinations of mole fractions x, y, and z at which the light-emitting wavelength from the well layers would be 1.3 μm and at which the strain amount of the well layers would be 2.0% or 2.5%. FIG. 12 illustrates combinations of x, y, and z in the case where the strain amount is 2.0%, while FIG. 13 shows combinations of x, y, and z in the case where the strain amount is 2.5%, both of which cases are shown as functions of the Sb mole fraction y. Simultaneously, a conduction band discontinuity value $\Delta E_c$ between the obtained well layer and the GaAs barrier layer or guide layer is also illustrated.

As to the composition of the well layers of i-$Al_{0.5}Ga_{0.95-x}In_xN_zAs_{1-y-z}Sb_y$ that provides a specified emission wavelength (1.3 μm) and a certain strain value (2.0% or 2.5%), FIGS. 12 and 13 reveal that as the Sb mole fraction y increases, the In and N mole fractions x and z can be reduced.

In Applied Physics Letters, Vol. 78, No. 10, 2001, p. 1364, the inventor of the present application, et al. have reported a technique that in forming a III–V compound semiconductor crystal containing nitrogen and other V-group elements, crystal growth is performed by the MBE method while adding aluminum, whereby it becomes possible to remarkably enhance the usability of a nitrogen source such as ammonia. Although inclusion of aluminum has the advantage as above, it has a problem in that the bandgap width is broadened as the Al mole fraction increases. For example, in the case where aluminum is intermixed with GaInNAs, in order to cancel the increase of the bandgap width due to aluminum, it was necessary to increase the In and/or N mole fraction. In particular, in this mixed crystal system wherein the crystallinity (the light-emitting characteristics in particular) exponentially deteriorates as the N mole fraction increases, the necessity of increasing the N mole fraction raises a serious problem. In the case where this mixed crystal system is used for a light-emitting layer of a light-emitting device, this leads to a deterioration of light-emitting efficiency, increase in power consumption and shortening of the life of the device.

On the other hand, in the invention of the present application, antimony is added, whereby the reduction of the bandgap width takes places by the effect of the addition of antimony. As seen in FIGS. 12 and 13, the N and I mole fractions z and x required for obtaining a certain bandgap width have been reduced. In FIGS. 12 and 13, taking, for example, the case where the Sb mole fraction y is 0.08, then the N mole fraction z is 0.01 for the strain amount of 2.0% in FIG. 12, while the N mole fraction z is 0.006 for the strain amount of 2.5% in FIG. 13. These values of the N mole fraction correspond to a N mole fraction in GaInNAs containing no aluminum that would be able to provide the same strain amount and the same bandgap width. That is, it turns out that in the case where both Al and Sb are intermixed with GaInNAs, Sb acts to cancel a broadened portion of the bandgap width, and acts to solve the problem caused by the inclusion of Al. In the case where Al is added to GaInNAs, etc., when attempting to obtain a crystal having a desired bandgap width (=light-emitting wavelength) and strain amount with the N mole fraction as small as possible, it is effective to add Al and Sb at the same time.

All of semiconductor laser elements 1100 that were fabricated to have the mole fractions indicated at the respective plots in FIGS. 12, 13, performed lasing at a wavelength of 1.3 μm. The threshold current at the time of the start of the lasing was 25 mA, and the characteristic temperature $T_0$ at a device temperature of 20° C. to 90° C. was 190 K. In this way, intermixing 2% or more of Sb has made it possible to obtain a semiconductor laser element having superior characteristics. Although Sb is intermixed, a large band discontinuity value of 250 meV or more of the conduction band is secured in the hetero junctions with adjacent layers, which means that high temperature characteristics are obtained. The semiconductor laser element whose well layer is composed of AlGaInNAsSb is not limited to one having a lasing wavelength of 1.3 μm, and it is a matter of course that semiconductor lasers may have other lasing wavelengths such as 1.55 μm.

(Embodiment 11)

In the present embodiment, a method for forming a GaInNAsSb mixed crystal (alloy crystal) by intermittent supply of sources. A GaAs/GaInNAsSb/GaAs single quantum well was fabricated.

Crystal growth was performed by a gas source molecular beam epitaxy (GS-MBE) method. Solid metal sources (metal gallium, metal indium, metal arsenic ($As_4$) and metal antimony) were used as the III-group sources and the arsenic and antimony sources, and dimethyl hydrazine (DMeHy) was used the nitrogen source. DMeHy, a gaseous material, was introduced to a vacuum chamber through a gas cell without conducting cracking or plasma excitation and then applied to a substrate. GaAs (100) was used as a substrate and crystal growth was conducted at a substrate temperature of 400° C.

Figure 14:
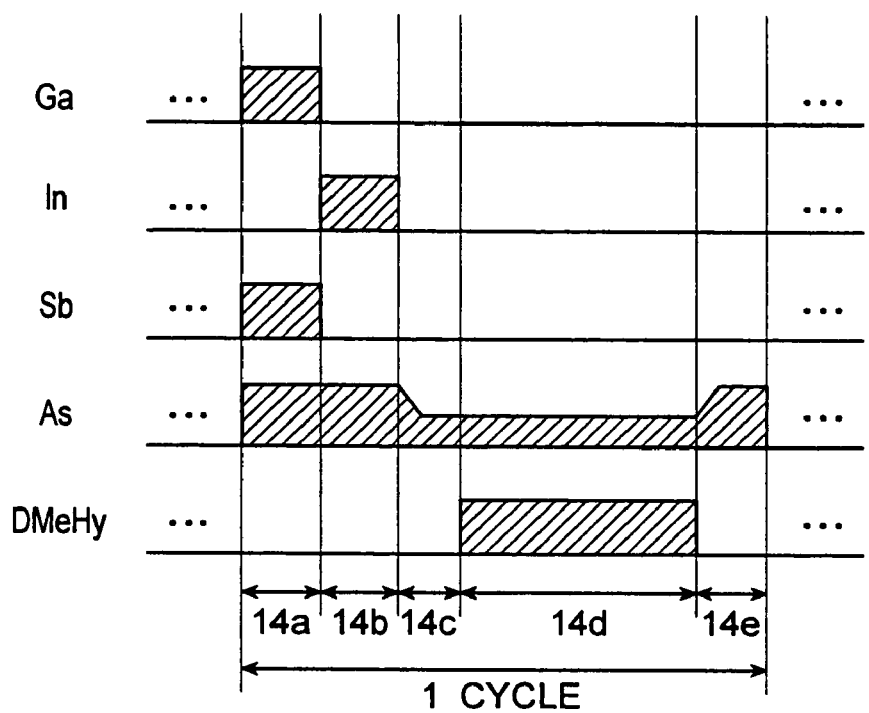
FIG. 14 is a diagram explaining a method for fabricating a GaInNAsSb mixed crystal by intermittent supply of sources, which is one embodiment of a crystal growth method according to the present invention, and showing the timing of supplying the respective sources.

After crystal-growing a GaAs lower barrier layer having a layer thickness of 1 μm by supplying the Ga and $As_4$ sources simultaneously, GaInNAsSb forming a well layer was grown according to a source supply sequence, shown in FIG. 14. That is, molecular beams of the sources of Ga, Sb, As were first supplied for 9 seconds in process 14a. The beam intensity of Ga was set to $2.5 \times 10^{-7}$ torr so that Ga corresponding to one atomic layer in terms of layer thickness was supplied in 3 seconds. The beam intensities of $As_4$ and Sb were $8.0 \times 10^{-6}$ torr and $8 \times 10^{-7}$ torr, respectively. Next, molecular beams of the sources of $As_4$ and Sb were supplied for 9 seconds in process 14b. The beam intensity of In was herein set to $1.6 \times 10^{-7}$ torr. Subsequently, irradiation with only $As_4$ molecular beams was performed for 5 seconds in process 14c. The beam intensity of $As_4$ was herein reduced to $5.0 \times 10^{-6}$ torr. After that, application of DMeHy molecular beams having an intensity of $3 \times 10^{-6}$ torr and $As_4$ molecular beams was performed for 60 seconds in process 14d. Then, $As_4$ molecular beams were supplied for 3 seconds in process 14e. The beam intensity of $As_4$ then was increased to $8.0 \times 10^{-6}$ torr. One cycle consisting of these processes 14a to 14e was repeated 4 times to crystal-grow a GaInNAsSb quantum well having a layer thickness of about 50 nm.

The composition of the mixed crystal of the well layer fabricated was $Ga_{0.87}In_{0.13}N_{0.01}As_{0.89}Sb_{0.01}$. This mixed crystal had a PL (photoluminescence) emission wavelength of 1.3 μm at room temperature and a full width at half maximum of the emission of 28 meV, which means that the light-emitting intensity was extremely strong. Similar results were obtained even if the order of process 14a and process 14b in FIG. 14 was changed.

With reference to Embodiment 11, the function and effect of the present invention will be described below. As described in Embodiment 8, the study on the intermixing of antimony by the inventor of the present application has revealed that, while it is easy to intermix antimony with a material system that does not contain indium (e.g., GaAs and AlGaAs), it is extremely difficult to intermix antimony with a material system containing indium (e.g., GaInAs) The reason for this is presumed to be that a very large non-miscible region is formed when a mixed crystal system containing In and a mixed crystal system containing Sb are intermixed, which means that the mixed crystal system containing In and the mixed crystal system containing Sb do not form a stable mixed crystal phase.

It was also found that for taking in antimony efficiently, growth conditions with a high degree of non-equilibrium are desirable, in particular, it is desirable to set the substrate temperature in the range of 400° C. to 500° C. In the case where the substrate temperature is set low in this manner, if the nitrogen source has been activated by plasma as in Embodiment 8, no problem occurs. However, if molecular sources that have not been activated by plasma are used as in the present embodiment, due to deficiency of thermal decomposition of the sources, drastic deterioration of the nitrogen adding efficiency may occur.

The present embodiment shows a growth sequence wherein the deterioration of the nitrogen adding efficiency is prevented even at low temperatures which are advantageous in intermixing antimony. In FIG. 14, the present embodiment is the same as Embodiment 8 in that intermixing of antimony is performed by supplying antimony but without supplying indium in process 14a, and that indium is added in process 14b. The present embodiment is characterized in that process 14d is provided after that. That is, DMeHy that is the nitrogen source is supplied without supplying the sources of group III elements, so that it becomes possible for sufficient nitrogen atoms to be adsorbed onto a surface of a grown layer. At a low substrate temperature of 400° C., thermal decomposition of DMeHy is not sufficient. But the supply rate of DMeHy is appropriately set and also the time of process 14d is appropriately set. Therefore, the insufficient thermal decomposition can be compensated by a total supply determined by multiplication of the supply rate of DMeHy by the supply time. That is, by separating processes 14a and 14b of supplying the group-III sources and intermixing antimony from process 14d of intermixing nitrogen, the supply conditions for the nitrogen source and the supply time thereof can be set regardless of the supply conditions for the group-III sources and the antimony source and the supply times thereof, thereby making it possible to obtain a desired mixed crystal.

Figure 9B:
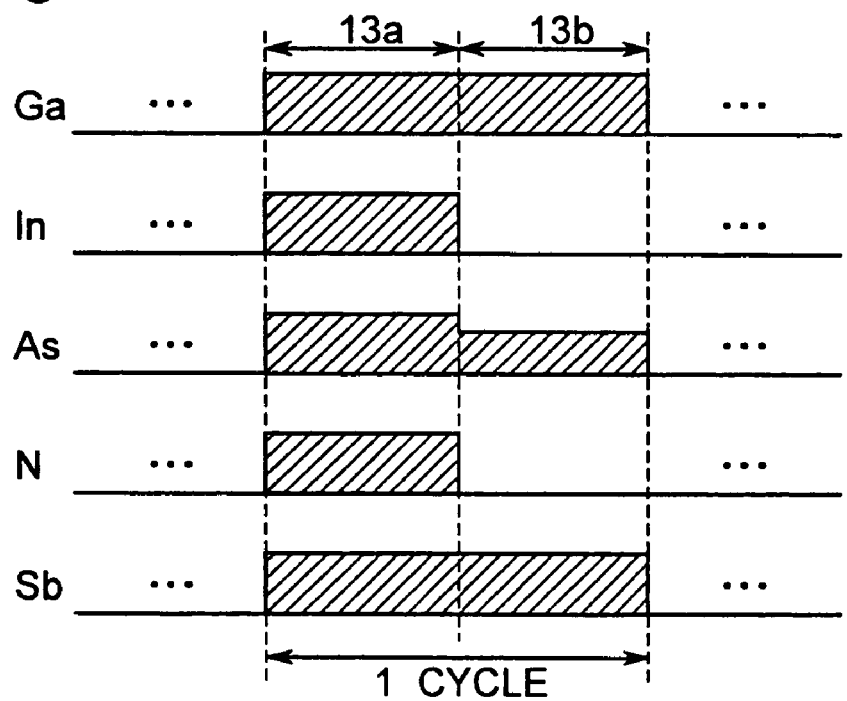
Figure 15:
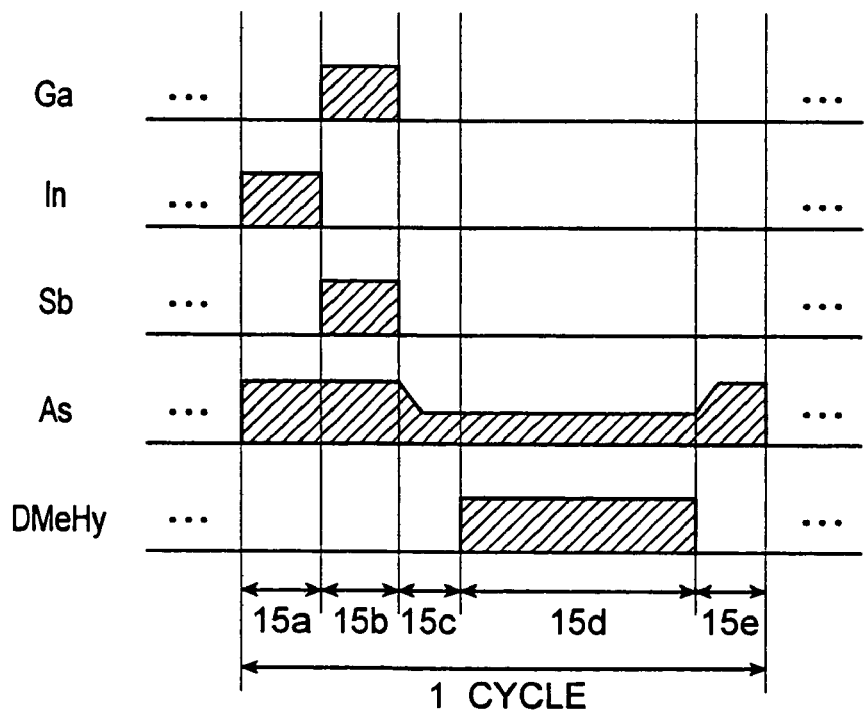
FIG. 15 is a diagram explaining a modified embodiment of the method for fabricating a GaInNAsSb mixed crystal by intermittent supply of sources, which is one embodiment of the crystal growth method according to the present invention, and showing the timing of supplying the respective sources.

Processes 14a and 14b may be replaced with each other as processes 15a and 15b in FIG. 15. As described with reference to FIG. 9B, there is no problem even if antimony is supplied while indium is being supplied. Further, there is no problem even if antimony is supplied in processes wherein the group-III sources are not supplied. In the embodiment, the nitrogen source is supplied only in process 14d or 15d, but it is not necessarily required that the nitrogen source be supplied only in this process. The nitrogen source may be supplied also in other processes as well, and it can be supplied in all the processes.

The thickness of a layer to be grown per cycle is set to a three-molecular layer in the above embodiment, but it is not necessarily required to be of a three-molecular layer. It is a matter of course that it may be of any number of molecular layers such as a two-molecular layer, a five-molecular layer or more, or instead of a natural number, 1.5-molecular layer.

Figure 16:
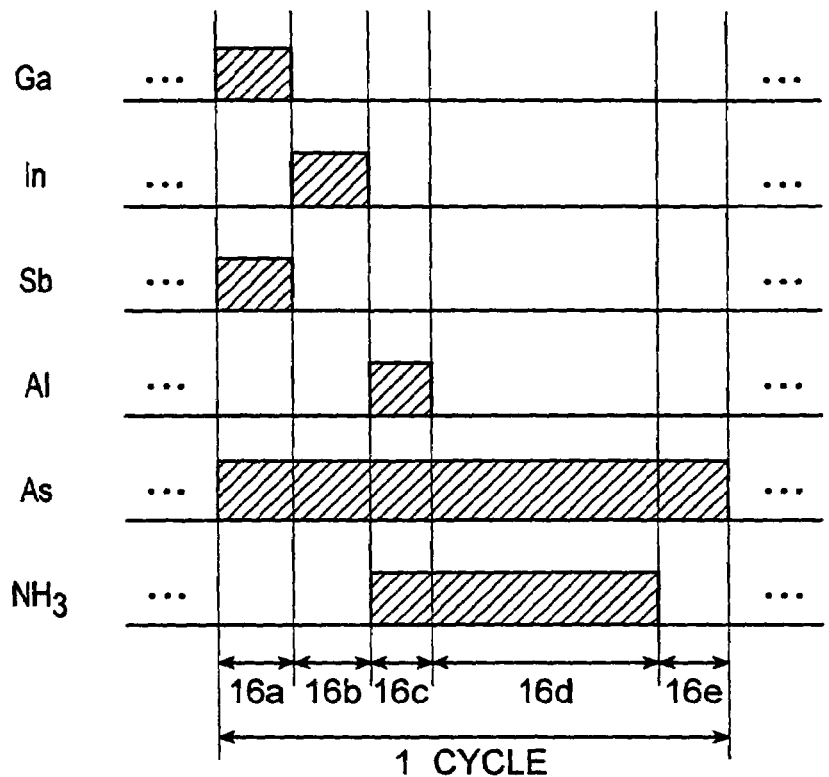
FIG. 16 is a diagram explaining a modified embodiment of the method for fabricating an AlGaInNAsSb mixed crystal by intermittent supply of sources, which is one embodiment of the crystal growth method according to the present invention, and showing the timing of supplying the respective sources.

In the case where a gas, such as ammonia ($NH_3$), whose thermal decomposition efficiency is lower than that of DMeHy used in Embodiment 11, is used, it is desirable to add aluminum in order to enhance the usability of the nitrogen source, as described in Embodiment 10. It is also desirable to set the Sb mole fraction in a manner so as to cancel the expansion of the bandgap width due to aluminum. When enhancing the utilization of nitrogen by adding aluminum in this way, a crystal growth sequence shown in FIG. 16 can be used. That is, after intermixing Ga, In, As and Sb in processes 16a and 16b, the supply of the sources of Al and $NH_3$ is started in process 16c. Thereafter, the supply of $NH_3$ is continued on process 16d, whereby it becomes possible to promote surface adsorption of nitrogen atoms from $NH_3$ by using high reactivity of aluminum that has been supplied and adhered to the crystal surface. The use of such processes provides a crystal growth method that is desirable for achieving all of: the low-temperature growth required for intermixing of antimony, the improvement in the usability of the nitrogen source at low temperatures attributed to aluminum; and the advantage attributed to the simultaneous intermixing of aluminum and antimony as described in Embodiment 10.

In this example, the supply of aluminum and $NH_3$ is started simultaneously in process 16c, but the supply is not necessarily required to be simultaneous. For example, $NH_3$ may be supplied in only process 16d, or it may be supplied in all the processes. Although Al is supplied to the surface after completion of the supply of the other group-III sources such as In and Ga, it may be supplied simultaneously with In and Ga. However, in that case, the surface exposure of aluminum becomes less while the nitrogen source is being supplied and thus there is a case in which the improvement effect in the usability of the nitrogen source somewhat deteriorates.

Figure 17:
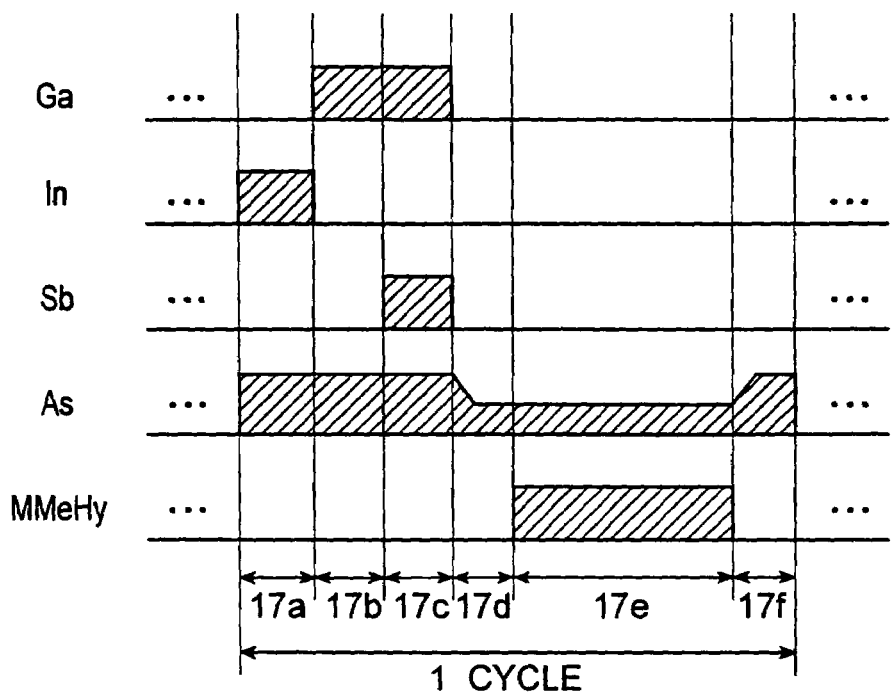
FIG. 17 is a diagram showing a modified example of supplying sources in Embodiment 11.
Figure 18:
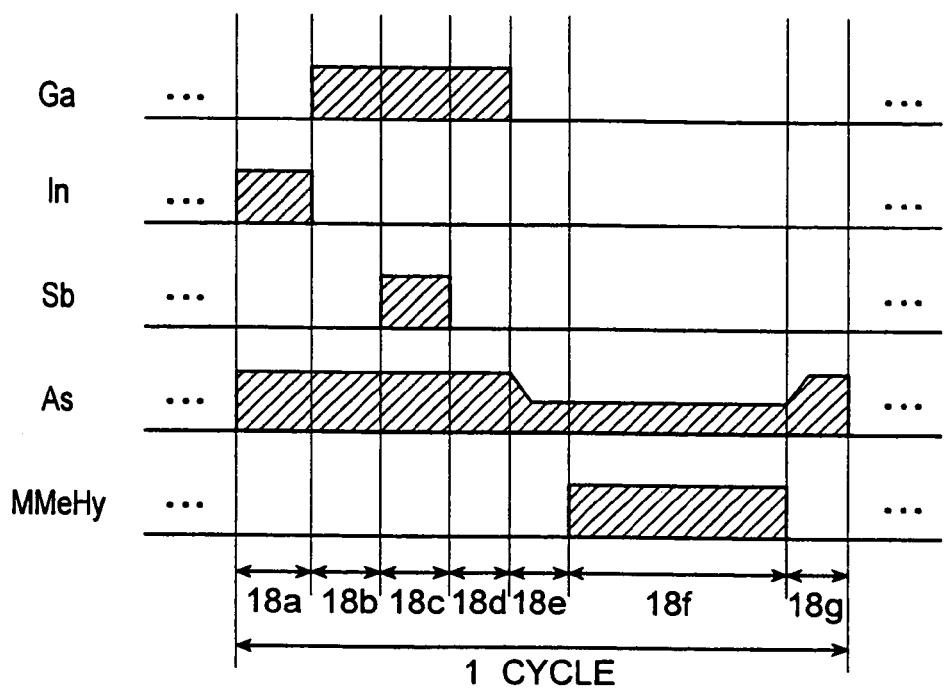
FIG. 18 is a diagram showing a modified example of supplying sources in Embodiment 11.
Figure 19:
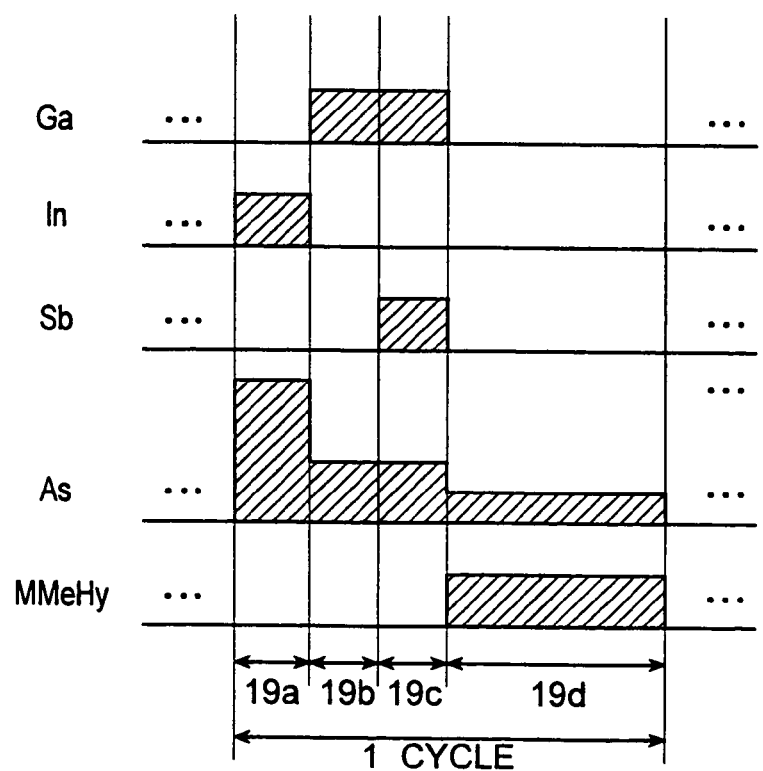
FIG. 19 is a diagram showing a modified example of supplying sources in Embodiment 11.

In this way, the In source and the Sb source are supplied at different times, and they are also spatially separated, whereby it has become possible to avoid the problems of the deterioration of the crystallinity attributed to non-miscibility and the deterioration of the taking of Sb into the film. In the case where a growth sequence wherein an intermediate layer not containing In or Sb is formed before supplying Sb, which is shown in FIG. 17, Sb is not adversely affected by In of the underlayer in the process of supplying Sb. This was effective for an improvement in the crystallinity and the taking efficiency of Sb. That is, after carrying out process 17a wherein a material containing an In source but not containing a Sb source is supplied, process 17b for supplying a material not containing an In source or an Sb source is carried out. Subsequently, process 17c for supplying a material not containing an In source but containing an Sb source is carried out. Consequently, the intermediate layer (herein GaAs) is formed between the layer containing In formed by process 17a and the layer containing Sb formed by process 17c. Thus, the layer containing In and the layer containing Sb are not in contact with each other. Therefore, it has become possible to avoid the problem of non-miscibility at the interface between the layer containing In and the layer containing Sb. Consequently, crystal having better crystallinity is obtained. Process 17a and process 17c may be replaced with each other. GaAs is desirable as the intermediate layer at this time. This intermediate layer is required to be of a thickness of a one-molecular layer or more because of the necessity of covering the underlayer completely, but is preferably not more than about a two-molecular layer so that the influence on the whole crystal composition becomes lessened. As shown in FIG. 18, it is possible to form a cap layer not containing In or Sb in process 18d immediately before supply of a III-group element source is stopped in process 18e. This cap layer makes it possible to suppress segregation or demixing of In from the surface and thermal volatilization of Sb. It is desirable that this cap layer is also GaAs and that the layer thickness is one-molecular layer or more, but not more than two-molecular layer. It is not necessarily required that the processes of supplying Group III elements and Sb be continued. For example, a growth-interruption time wherein only As is supplied may be provided. This applies to all the other embodiments. Further, the feed rate of As does not require to be fixed through the processes, and it may be varied. For example, in the case where the As feed rate is increased in process 19a of supplying In shown in FIG. 19, the effect of promoting the planarization of the surface with the migration of In suppressed, and the effect of enhancing the spatial separation of In from Sb with the surface segregation of In suppressed are expected.

(Embodiment 12)

Figure 20:
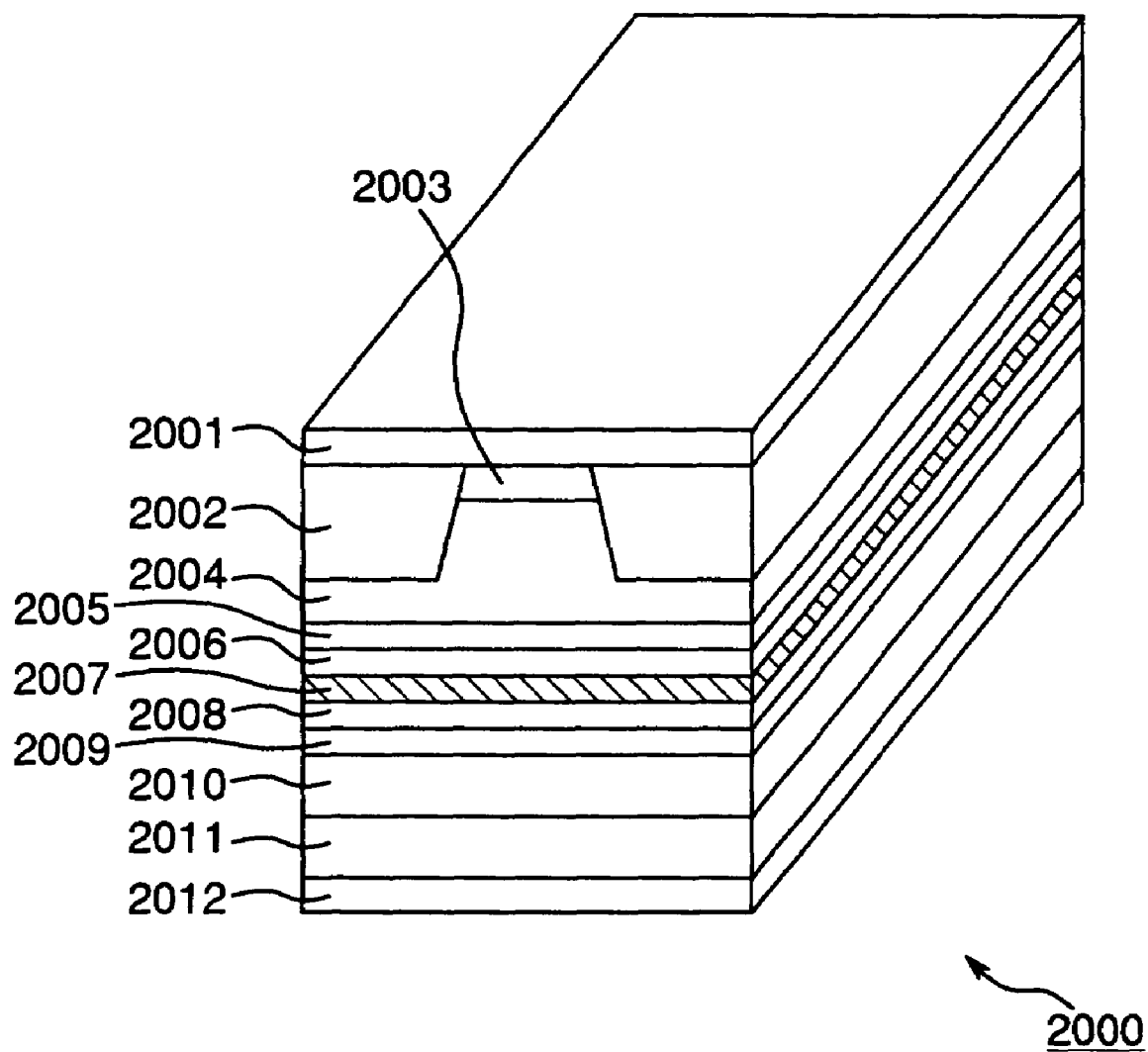
FIG. 20 is a perspective view of a semiconductor laser device in Embodiment 12.

FIG. 20 shows a semiconductor laser element 2000 that is one embodiment of the semiconductor device of the invention of the present application. This semiconductor laser element 2000 is fabricated using a GaAs substrate and designed to perform lasing at a wavelength of 1.3 μm. The details of each portion are as follows:

p-type electrode metal 2001 . . . AuZn
current concentration layer 2002 . . . polyimide
contact layer 2003 . . . p-type GaAs, 0.5 μm
upper cladding layer 2004 . . . p-type $Al_{0.5}Ga_{0.5}As$, 1 μm
upper guide layer 2005 . . . i(intrinsic)-$Al_{0.25}Ga_{0.75}As$, 0.1 μm
upper barrier layer 2006 . . . i-$Al_{0.1}Ga_{0.9}As$, 0.1 μm
well layer 2007 . . . i-$Ga_{0.76}In_{0.24}N_{0.0022}As_{0.8978}Sb_{0.1}$, 8 nm strain amount of 2.4%
lower barrier layer 2008 . . . i-$Al_{0.1}Ga_{0.9}As$, 0.1 μm
lower guid layer 2009 . . . i-$Al_{0.25}Ga_{0.75}As$, 0.1 μm
lower cladding layer 2010 . . . n-type $Al_{0.5}Ga_{0.5}As$, 1 μm
substrate 2011 . . . n-type GaAs
n-type electrode metal 2012 . . . AuGe Layers from the lower cladding layer 2010 through the contact layer 2003 were crystal-grown on the GaAs (100) substrate 109 using a molecular beam epitaxy (MBE) method. In the MBE method used here, as sources of the elements (Al, Ga, In, As, Sb) excluding N, solid sources (metal Al, metal Ga, metal In, metal As, metal Sb) were used. Nitrogen gas excited by ECR plasma was used as a nitrogen source. After the crystal growth by the MBE method, part of the upper cladding layer 2004 and the contact layer 2003 was etched into a 3-μm wide stripe-shape to form a ridge-shaped waveguide structure. The current contraction layer 2002 was formed on side surfaces of the ridge. The electrodes 2001, 2012 were formed at the top and the bottom. Subsequently, end-face mirrors were formed in a direction perpendicular to that of the ridge by cleavage.

The semiconductor laser element 2000 performed lasing at a wavelength of 1.3 μm. The threshold current density $J_{th}$ at the lasing start time when the resonator length (L) was set to 300 μm was 0.2 kA/cm$^2$, and the lasing at a low current was observed. The characteristic temperature $T_0$ when the device temperature was in the range of between 20° C. and 90° C. was 195 K, which means that the semiconductor laser element was superior in temperature characteristics.

While Embodiments 1 to 6 show the examples wherein GaAs is used as the layer (the barrier or guide layer) adjacent to the GaInNAsSb well layer, AlGaAs having a wider bandgap width than that of GaAs is used in the present embodiment. Therefore, a conduction band energy difference ΔEc in the hetero junction between the well layer and the barrier layer can be made larger, compared with the case where GaAs is used as the barrier layer, so that the Sb mole fraction in the well layer is able to be increased more. This has made it possible to obtain an mixed crystal having a predetermined wavelength even if the N mole fraction of the well layer is further reduced. Consequently, the lasing at a lower threshold current has been achieved while maintaining the sufficient temperature characteristics. In the above composition, a large value of about 300 meV is secured as a conduction band energy difference ΔEc in the hetero junction between the GaInNAsSb well layer and AlGaAs adjacent the well layer.

In the structure of FIG. 20, the compositions of the layers from the lower guide layer to the upper guide layer are not limited to those shown above, but as shown below, the Al mole fraction of the layers (the upper and lower barrier layers 2006, 2008) adjacent the well layer may be increased.

upper guide layer 2005 . . . i-$Al_{0.1}Ga_{0.9}As$, 0.15 μm
upper barrier layer 2006 . . . i-$Al_{0.3}Ga_{0.7}As$, 0.05 μm
well layer 2007 . . . i-$Ga_{0.76}In_{0.24}N_{0.0022}As_{0.8978}Sb_{0.1}$, 8 nm, strain amount of 2.4%
lower barrier layer 2008 . . . i-$Al_{0.3}Ga_{0.7}As$, 0.5 μm
lower guide layer 2009 . . . i-$Al_{0.1}Ga_{0.9}as$, 0.15 μm By further increasing the Al mole fraction of the layers (the upper and lower barrier layers 2006, 2008) adjacent the well layer, the confinement of carriers into the well layer can be enhanced. In this case, because the conduction band energy difference ΔEc in the hetero junction between the well layer and the barrier layer can further be increased, it has become possible to further increase the Sb mole fraction of the well layer. This has made it possible to obtain a mixed crystal, or alloy crystal, having a predetermined wavelength even if the N mole fraction is further reduced, resulting in the lasing at a lower threshold current. In the case of the above structure, the Al mole fraction of the upper and lower guide layers 2005, 2009 is lower than that of the upper and lower barrier layers 2006, 2008 in order to enhance the confinement of light into the well layer.

Alternatively, in the structure of FIG. 20, the compositions of the layers from the lower guide layer through the upper guide layer may be arranged as follows:

upper guide layer 2005 . . . i-$Al_{0.25}Ga_{0.75}As$, 0.1 μm
upper barrier layer 2006 . . . i-$al_{0.25}Ga_{0.75}As/GaAs$, 3 pairs, 0.15 μm
well layer 2007 . . . i-$Ga_{0.76}In_{0.24}N_{0.0022}As_{0.8978}Sb_{0.1}$, 8 nm strain amount of 2.4%
lower barrier layer 2008 . . . i-$Al_{0.25}Ga_{0.75}As/GaAs$, 3 pairs, 0.15 μm
lower guide layer 2009 . . . i-$Al_{0.25}Ga_{0.75}As$, 0.15 μm, The layers (the upper and lower barrier layers 2006, 2008) adjacent the well layer are composed of multi-layer films, thereby making it possible to enhance the confinement of carriers into the well layer. In this case, because the conduction band energy difference ΔEc in the hetero junction between the well layer and the barrier layer can further be increased, it has become possible to further increase the Sb mole fraction of the well layer. This has made it possible to obtain a mixed crystal having a predetermined wavelength even if the N mole fraction is further reduced, resulting in the lasing at a lower threshold current. At this time, it is desirable that each of the multi-layer films adjacent the well layer is designed to function as a MQB (=Multi quantum barrier) against electrons overflowed from the well layer.

As described above, by broadening the bandgap width of the barrier layers adjacent the well layer, the Sb mole fraction of the well layer can be increased. However, it was found that the Sb mole fraction that can be contained in a crystal while maintaining good crystallinity has an upper limit in accordance with the In mole fraction due to the influence of the non-miscible region (miscibility gap) formed in the case where an mixed crystal system containing In and an mixed crystal system containing Sb are mixed. According to the study of the inventor of the present application, for the In mole fractions of 10%, 20% and 30%, upper limits of the Sb mole fraction that can maintain good crystallinity are 30%, 20% and 10%, respectively. That is, a total of the In mole fraction and the Sb mole fraction is required to be not more than 40%.

It is a matter of course that the present invention is not limited to the combinations of the specific crystal systems, mixed crystal compositions, bandgaps, wavelengths, hetero junctions, and device structures as described in each of the above embodiments. In particular, the device is not limited to a semiconductor laser, and the present invention can be applied to fabrication of any optical device such as a light emitting diode, a light-receiving element, an optical waveguide element and a solar battery, and any electronic device such as a transistor, an FET and an HEMT.

In the embodiments of the present application, cases in which several percent of N is intermixed with a III–V compound semiconductor are taken, III-group elements (B, Tl etc.) and V-group elements (P, Bi) other than those described in detail in the embodiments may appropriately be mixed. An impurity element (C, Zn, Be, Mg, Te, S, Se, Si, etc.) may also be appropriately included. Further, the substrate is not limited to the one used in the embodiments, the same effect can be obtained even if other substrates are used. For example, other III–V compound semiconductor substrates such as an InGaAs substrate, II-V compound semiconductor substrates such as a ZnSe substrate, IV-group semiconductor substrates such as a Ge or SiC substrate, glass, plastics, ceramics and the like can be used.

In all the embodiments shown so far, the crystal growth method is not limited to those shown, and other methods can appropriately be selected. For example, a vacuum evaporation method, a vacuum sputtering method, an atmospheric CVD method, a MO-MBE method, a photo CVD method, a plasma CVD method and the like are also applicable.

It is a matter of course that sources of the constituent elements used for the crystal growth are not limited to the specific sources described in the embodiments or the specific combinations of the sources, and any possible sources can be used in any possible combinations. In the mixed crystal grown, the combination of the mole fractions in each composition is not limited to the specific ones described in the embodiments, but the mole fractions in each composition may be selected as desired. All the embodiments shown relate to cases in which the mixed crystal of the present invention is applied to the well layers in the quantum well structure. The number of well layers, the strain amount and the thickness of the well layers in the quantum well structure have no limitation. Further, a compressive or tensile strain may also be introduced to the barrier layers. Not only the quantum well structure but also the bulk crystal may be usable.

In the above description, the direction indicated by the term "upper" shows a direction going away from the substrate, while the direction indicated by "lower" shows a direction approaching the substrate. The crystal growth proceeds from the "lower" side toward the "upper" side.

As is apparent from the above description, according to the invention of the present application, in a III–V compound semiconductor layer containing N and other V-group elements, by further intermixing Sb, a crystal having superior characteristics (light-emitting characteristics in particular) is obtained. Better characteristics are obtained in a semiconductor device using this layer. Particularly, it is effective to obtain a low threshold current density and a high characteristic temperature in light-emitting devices.

In the crystal growth method of the present invention, it is possible to achieve an improvement in the efficiency of taking in antimony when growing an mixed crystal containing indium and antimony, and an improvement in the crystallinity (the light-emitting characteristics in particular).

What is claimed is:

1. A semiconductor device comprising a III–V compound semiconductor layer containing gallium and indium, and as V-group components, nitrogen and antimony, and one or more V-group elements other than nitrogen and antimony, wherein Sb is intermixed in the III–V compound semiconductor layer to form a mixed crystal semiconductor layer, and wherein a Sb mole fraction in the V-group components of the III–V compound semiconductor layer is 0.02 or more but less than 1, and wherein the III–V compound semiconductor layer emits light at a wavelength of about 1.3 μm and the Sb mole fraction y of the III–V compound semiconductor layer satisfies:

$$y \leq -0.014\epsilon + 0.173 \ldots \quad (1)$$

where $\epsilon$ is a strain amount (%) of the III–V compound semiconductor layer.

2. The semiconductor device according to claim 1, comprising a further III–V compound semiconductor layer adjacent the III–V compound semiconductor layer, wherein a band discontinuity value between conduction bands of the III–V compound semiconductor layer and the further III–V compound semiconductor layer is 250 meV or more.

3. The semiconductor device according to claim 2, wherein the further III–V compound semiconductor layer is of a III–V compound semiconductor selected from GaAs, or any of AlGaAs, GaInP and InGaAsP that generally lattice-match with GaAs.

4. The semiconductor device according to claim 1, wherein the III–V compound semiconductor layer contains Al as a III-group component.

5. The semiconductor device according to claim 4, wherein an antimony content included in the III–V compound semiconductor layer is in an amount of more than required for canceling an increase of a bandgap width due to aluminum.

6. The semiconductor device according to claim 1, wherein a V-group element other than nitrogen and antimony in the III–V compound semiconductor layer is arsenic.

7. The semiconductor device according to claim 1, wherein the III–V compound semiconductor layer constitutes a well layer of a semiconductor laser element, and when the semiconductor laser element has an infinite resonator length, a threshold current density thereof is not more than 0.3 kA/cm².

8. The semiconductor device according to claim 1, wherein the Sb mole fraction of the III–V compound semiconductor layer is between 0.045 amid 0.075 inclusive.

9. A system comprising a semiconductor device,
the semiconductor device comprising a III–V compound semiconductor layer containing gallium and indium, and as V-group components, nitrogen and antimony, and one or more additional V-group elements other than nitrogen and antimony, wherein Sb is intermixed in the III–V compound semiconductor layer to form a mixed crystal semiconductor layer, and wherein a Sb mole fraction in the V-group components of the III–V compound semiconductor layer is 0.02 or more but less than 1, and wherein the III–V compound semiconductor layer emits light at a wavelength of about 1.3 μm and the Sb mole fraction y of the III–V compound semiconductor layer satisfies:

$$y \leq -0.014\epsilon + 0.173 \ldots \quad (1)$$

where $\epsilon$ is a strain amount (%) of the III–V compound semiconductor layer.

10. The system according to claim 9, wherein the system is an optical communication system including an optical transmission-reception module, said optical transmission-reception module comprising:
a transmitting part for transmitting an optical signal; and
a light-receiving detector part for receiving an optical signal and converting the received optical signal to an electrical signal,
wherein at least the transmitting part includes the semiconductor device.

* * * * *